United States Patent
Shiomi

[19]

[11] Patent Number: 6,132,550
[45] Date of Patent: Oct. 17, 2000

[54] APPARATUSES FOR DESPOSITION OR ETCHING

[75] Inventor: Hiromu Shiomi, Itami, Japan

[73] Assignee: Sumitomo Electric Industries, Ltd., Osaka, Japan

[21] Appl. No.: 08/694,457

[22] Filed: Aug. 7, 1996

[30] Foreign Application Priority Data

Aug. 11, 1995 [JP] Japan ................................ 7-206211

[51] Int. Cl.[7] .......................... C23C 16/00; C23C 14/00; C23F 1/02; C25B 9/00
[52] U.S. Cl. .................. 156/345; 118/723; 204/298.01; 204/298.23; 204/298.31
[58] Field of Search ...................... 118/723; 204/298.01, 204/298.23, 298.31

[56] References Cited

U.S. PATENT DOCUMENTS

| | | | |
|---|---|---|---|
| 4,866,346 | 9/1989 | Gaudreau et al. | 315/111.21 |
| 4,940,015 | 7/1990 | Kobashi et al. | 118/723 |
| 4,987,284 | 1/1991 | Fujimura et al. | 219/121.43 |
| 5,003,152 | 3/1991 | Matsuo et al. | 219/121.59 |
| 5,134,965 | 8/1992 | Tokuda et al. | 118/723 |
| 5,242,663 | 9/1993 | Shiomi et al. | 422/186.29 |
| 5,272,360 | 12/1993 | Todoroki et al. | 257/60 |
| 5,389,154 | 2/1995 | Hiroshi et al. | 118/723 |

FOREIGN PATENT DOCUMENTS

| | | |
|---|---|---|
| 63-84726 | 4/1988 | Japan . |
| 63-98330 | 4/1988 | Japan . |
| 3-327524 | 12/1991 | Japan . |
| 63-64074 | 3/1993 | Japan . |
| 5166596 | 7/1993 | Japan . |
| 6275566 | 9/1994 | Japan . |
| 7-54757 | 6/1995 | Japan . |
| 7-54758 | 6/1995 | Japan . |
| 07268622 | 10/1995 | Japan . |
| 08064583 | 3/1996 | Japan . |
| 9429494 | 12/1994 | WIPO . |
| WO 94/29494 | 12/1994 | WIPO . |

OTHER PUBLICATIONS

Grill, A. (Cold Plasma in Materials Fabrication: From Fundamentals to Applications). IEEE Press, 1994.

Oyo Buturi, vol. 64, No. 6, pp. 526–535, Plasma reactor and subject of control, published Jun. 1995 (with translation of pp. 526–528).

IEEE Press, *Cold Plasma in Materials Fabrication From Fundamentals to Applications*, by Alfred Grill, IBM Research Division, T.J. Watson Research Center, Yorktown Heights, New York, pp. 26–29 (1994).

*Silicon Depostion on a Rotating Disk*, by Richard Pollard and John Newman, Materials and Molecular Research Division, Lawrence Berkeley Laboratory and Department of Chemical Engineering, University of California, Berkeley, California, published Mar. 1980 (pp. 744–752).

*Industrial Plasma Engineering vol. 1: Priciples*, by J. Reece Roth, Department of Electrical and Computer Engineering, Unversity of Tennessee, Knoxville, Institute of Physics Publishing, Bristol and Philadelphia, published 1995 (pp. 484–501).

*Primary Examiner*—James C. Housel
*Assistant Examiner*—V. Ryan
*Attorney, Agent, or Firm*—Smith, Gambrell & Russell, LLP

[57] ABSTRACT

The apparatus according to the present invention is capable of maintain a plasma at relatively high pressure while preventing a window from being heated or sputtered by the plasma. The reaction chamber includes (1) an entrance window for guiding an electromagnetic wave such as a microwave or an RF to the reaction chamber, (2) a reaction room where film formation or etching for a substrate is performed by exciting a gas with the electromagnetic wave such as the microwave or the RF, and (3) an intermediate room arranged between the reaction room and the entrance window and having a pressure higher than that in the reaction chamber. The gas in the intermediate room is not excited with the electromagnetic wave such as the microwave or the RF.

22 Claims, 26 Drawing Sheets

PLAN VIEW OF CONDUCTANCE
REGULATION WINDOW

Fig.24A TM₀₁₂
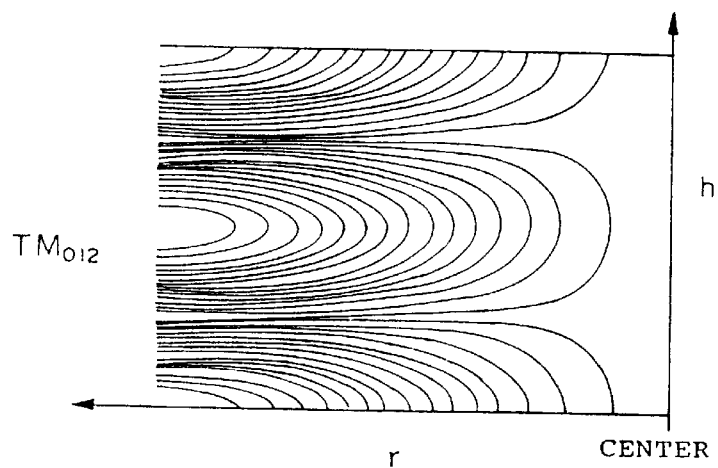
Fig.24B TM₁₁₂
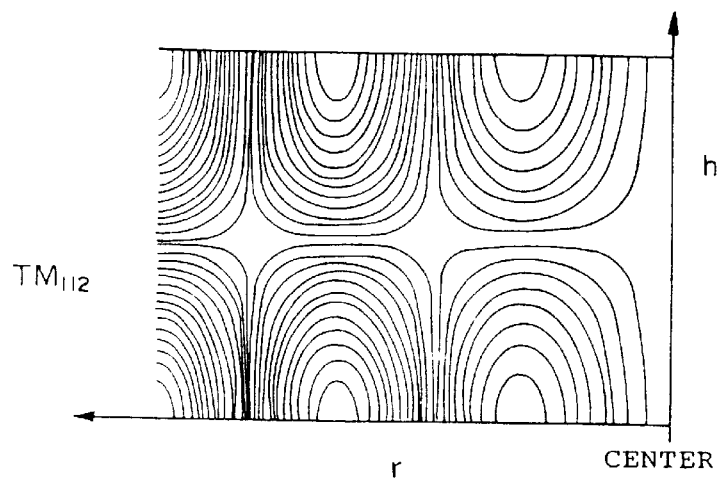
Fig.24C TM₀₂₂
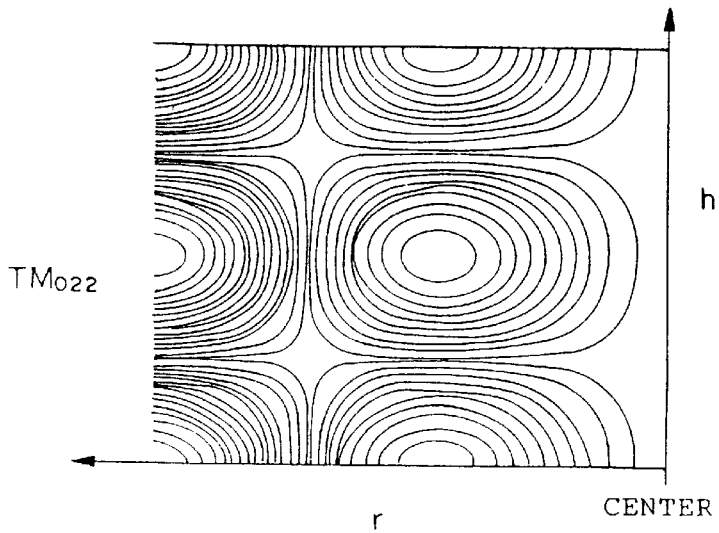

Q: FLOW RATE ($Pa \cdot m^3 \cdot sec^{-1}$)

APPARATUSES FOR DESPOSITION OR ETCHING

BACKGROUND OF THE INVENTION

1. Field of the Invention

The present invention relates to a deposition apparatus and an etching apparatus, which employ microwave plasma or a radio frequency (RF) plasma and, more particularly, to a deposition apparatus and an etching apparatus, which can minimize damage to a microwave or RF entrance window and maintain the stability of a plasma by locating the plasma away from the entrance window.

2. Related Background Art

Microwave plasma or radio frequency plasma (RF plasma) is used to regulate and enhance a plasma in depositing or etching processes such as plasma CVD or plasma etching, for the purpose of increasing the processing efficiency. For example, microwave CVD or RF plasma CVD is often used for the vapor-phase synthesis of diamond. Vapor-phase synthesis of diamond for which microwave CVD or RF plasma CVD is usable will be described below from the viewpoint of its applicability.

Diamond is a useful material for cutting and polishing tools because of its excellent hardness, wear resistance, and thermal conductivity. In addition, wide electrical and optical applications are expected because diamond has a wide band gap, a high resistance to radiation, and optical transparency for wide range of from infrared to ultraviolet. In particular, to apply diamond with importance being placed on its optical or electrical properties, a diamond film with a large area and high quality must be obtained by controlling inclusion of impurities.

Methods for synthesizing diamond can be generally classified into high-pressure synthesis and vapor-phase synthesis. In particular, vapor-phase synthesis is superior in controlling a large area and impurities. Conventionally, various vapor-phase synthesis methods have been examined to synthesize diamond, including filament CVD, microwave plasma CVD, radio frequency plasma (RF plasma) CVD, a plasma jet method, and a combustion flame method. Of the synthesis methods above, microwave plasma CVD and RF plasma CVD are suitable for synthesis of high-purity diamond. Otherwise, inclusion of impurities poses a problem. For example, metal contamination is caused by a filament in filament CVD, or by an electrode in the plasma jet method. In the combustion flame method, nitrogen in air can hardly be prevented from being contained in diamond.

As described above, microwave plasma CVD and RF plasma CVD are superior in terms of the purity of resultant diamond is concerned, while it is difficult to obtain large area, high-density homogeneous plasma for large-area processing. Additionally, in these apparatuses, a window for guiding a microwave or an RF wave is heated by the plasma, so that the service life of the window or foreign substance generation is adversely influenced. Furthermore, the window is inevitably sputtered by the plasma.

Attempts for the improvement in guiding microwave into processing apparatus are disclosed in the art. For example, in Japanese Patent Publication No. 7-54757, the shape of a microwave antenna and the vacuum seal portion of a window are implemented to prevent the vacuum seal portion from being collided and damaged by the generated plasma. In this attempt, however, the entire window is inevitably sputtered by the plasma.

In Japanese Patent Publication No. 7-54758, a horn-shaped antenna is used to spread the plasma over the desired area. However, the effect of the apparatus disclosed in Japanese Patent Publication No. 7-54758 is obtained only in the case where a magnetic field is applied within a high-vacuum state at $1 \times 10^{-3}$ Torr, as described in the embodiments, which does not meet the typical diamond synthesis conditions.

In Japanese Patent Publication No. 7-54759, an efficient microwave introduction method is discussed in association with mode selection in microwave introduction regarding an applied magnetic field. However, this prior art examines only in a low-pressure plasma to which applying magnetic field is effective. No examination is made for the window for guiding a microwave, so solving the problem of the entrance window is not addressed.

In Japanese Patent Publication No. 7-11995, the gas supply method is implemented, and a discharge chamber is arranged near the antenna, thereby homogenizing the gas.

However, this apparatus can hardly efficiently generate a plasma in a reaction chamber at a pressure suitable for diamond synthesis, i.e., at a high pressure of, e.g., 1 Torr or more. This is because, at a relatively high pressure for obtaining a high-density plasma, the plasma generated near the microwave entrance window does not spread to a substrate. In addition, at a high pressure, the mean free path of charged particles becomes shorter than that at a low pressure, though plasma control using a magnetic field becomes more difficult than that at a low pressure. For this reason, the microwave entrance window is inevitably heated and sputtered by the plasma. Furthermore, since the plasma distribution is non-uniform because of the non-uniformity of the electric field of the microwave, heterogeneity of the diamond film cannot be avoided.

In particular, when a plasma is generated at a high pressure of 1 Torr or more, the plasma is also excited near the microwave entrance window, so the plasma cannot be stably maintained. The microwave entrance window on which the atmospheric pressure acts is heated and damaged.

Japanese Patent Application Laid-Open No. 5-166596 discloses an attempt to solve the above mentioned problem on microwave entrance window, in which a microwave processing apparatus is provided with a slit at downstream side from a microwave entrance window of a waveguide to decrease pressure around the microwave entrance window. In this apparatus, plasma generation is inhibited around the window because of the lower pressure, so that the damage of the entrance window is avoided. Japanese Patent Application Laid-Open No. 6-275566 also discloses another attempt to solve the above mentioned problem, in which plurality of partition plates is disposed in a microwave plasma processing apparatus, where the partition plates is positioned at a location relatively far from the substrate holder, thereby reducing damage of substrate.

However, these attempts do not address to the case where higher microwave power is required for processing, e.g., deposition of diamond materials. In such case, higher microwave power cause the local temperature elevation in plasma, thereby damaging microwave entrance window. When synthesis is performed at a low temperature in such conventional apparatus, the substrate is subjected to microwave, and is inductively heated by the microwave. Further, in the conventional apparatuses, a diamond film thickness distribution is formed even on a flat substrate. The conventional apparatuses cannot be applicable to substrates having three-dimensional shape.

SUMMARY OF THE INVENTION

The present invention has been made in consideration of the above problems, and has as its object to provide processing apparatus employing microwave plasma or RF plasma, which is capable of stably maintain plasma at higher pressure, while preventing entrance window from being heated or sputtered by the plasma.

An another object of the present invention is to provide a processing apparatus employing microwave plasma or RF plasma, which is capable of forming plasma with applying higher power to form uniform plasma, while preventing entrance window from being heated or sputtered by the plasma, thereby achieving uniform processing at higher processing rate.

According to the present invention, there is provided a processing apparatus in which an electromagnetic wave is guided into a reaction chamber through an entrance window to create a plasma from a gas in the reaction chamber for deposition or etching, comprising: a vacuum reaction chamber; a means for introducing gases into the reaction chamber; a means for evacuating gases from the reaction chamber; a means for guiding the electromagnetic wave into the reaction chamber, wherein the reaction chamber is partitioned, by a conductance regulating means for regulating conductance of the reaction chamber, into a reaction region in which a substrate is placed on a substrate holding means and an intermediate region on the entrance window side, the means for introducing gases being connected to the intermediate region, the means for evacuating gases being connected into the reaction region, and wherein a gas pressure in the intermediate region is set at a pressure which is higher than that in the reaction region and at which the gas is not excited by the electromagnetic wave, the gases flowing from the intermediate region through the conductance regulating means into the reaction region.

The apparatus according to the present invention has a constitution in which the intermediate or interposed region with a pressure at which no plasma is formed is arranged between the reaction region and the entrance window in the reaction chamber, so that the entrance window is prevented from being exposed to the plasma for substrate processing.

In the apparatus of the present invention, the pressure in the intermediate region may be set at a pressure at which breakdown does not occur according to the Paschen's law represented as follows:

$$Eb = \frac{C_1 P}{C_2 + \ln(Pd)} \quad (1)$$

where,
Eb: breakdown field
P: pressure
d: inter-electrodes distance
$C_1$, $C_2$: constant depending on a gas type
and when P is large, said Paschen's law can be expressed by:

$$Eb = \frac{C_1 P}{C_2 + \ln(Pd)} < \frac{C_1}{C_2} P \quad (2)$$

For the apparatus of the present invention, the pressure in the intermediate region may be a pressure higher than a pressure for maintaining microwave discharge with respect to a predetermined electromagnetic wave such as a microwave or a RF, and a pressure in the reaction region may be a pressure lower than the pressure for maintaining microwave discharge. With this pressure setting, plasma generation in the intermediate region can be properly prevented, and the plasma can be stably maintained in the reaction region.

For the apparatus of the present invention, the conductance regulating means may have at least one through-hole, so that a gas flow is formed from the intermediate region toward the reaction region through the through-hole of the conductance regulating means. When the gas flow is formed, non-uniformity of the plasma caused by the field distribution in the reaction region is compensated.

For the apparatus of the present invention, the pressure in the intermediate region may be set within a range of 100 Torr to 1,520 Torr (2 atom). Within this pressure range, plasma generation is suppressed, and the entrance window is satisfactorily fixed.

For the apparatus of the present invention, the conductance regulating means has a shape conforming to a shape of the substrate or a shape of a three dimensionally-shaped base on which deposition or etching is performed. When the conductance regulating means having a shape substantially conformal to the shape of a three-dimensional base or substrate is used, uniform deposition or etching into three dimensional geometry can be performed.

The apparatus of the present invention may further comprise a counter electrode which is arranged in one of the intermediate region and the reaction region to oppose the substrate for film formation or etching such that the electromagnetic wave such as the microwave or RF guided to the reaction region has a uniform electric field in the reaction region. By arranging the counter electrode, the field distribution in the reaction region is averaged, so that attenuation of electric field is suppressed.

For the apparatus of the present invention, the counter electrode may be arranged in the intermediate region. With this arrangement of the counter electrode, a more uniform field distribution can be obtained.

The apparatus of the present invention may further comprise a conductive grid arranged between the conductance regulating means and the substrate arranged in the reaction region for film formation or etching to shield the electromagnetic wave reaching the substrate. When the electromagnetic wave reaching the substrate is shielded, the substrate is prevented from being heated.

The apparatus according to the present invention may further comprise a cylinder within the chamber, the cylinder and the conductance regulation window partitioning the chamber into the reaction region in which the substrate is placed and the intermediate region which is located outside the cylinder and inside the chamber, wherein the chamber is a bell jar, the bell jar itself functioning as the entrance window. In this constitution, the entire bell jar itself functions as the entrance window for the electromagnetic wave. Thus, additional entrance window is not required, simplifying the apparatus. Further, this allows to used one apparatus for carrying out deposition or etch processes of different materials with improved reproducibility, by using different elements exposed to processing condition for the different material having different composition.

The apparatus according to the present invention may further comprise a means for rotating the substrate at a high rotation speed higher than 100 r.p.m. The high speed substrate rotation allows to suitably create a gas flow around the substrate to enhance the plasma uniformity, resulting further processing uniformity. By "high speed" it is meant to be a rotation speed ranging from 100 to 5,000 r.p.m., and more preferably from 300 to 3,000 r.p.m.

The apparatus according to the present invention may further comprises a means for applying an RF power to the substrate. RF biasing to the substrate can result in creating uniform nucleation on the surface of the substrate.

The apparatus according to the present invention may further comprise a counter electrode which is arranged in one of the intermediate region and the reaction region, to face the substrate such that the electromagnetic wave guided into the reaction region creates a uniform electric field therewithin, the counter electrode including a first material including an chemical species which is included in a second material to be deposited on the substrate. Alternatively, in the apparatus according to the present invention, the conductance regulating window may include a first material including an chemical species which is included in a second material to be deposited on the substrate. Preferably, the chemical species is a carbon atom, and the second material is a diamond. Employing the counter electrode including such chemical species allows to reduce the contamination from the counter electrode. Further, the chemical species (e.g., carbon) can be additionally supplied from the counter electrode (e.g., graphite) to form material (e.g., diamond), thereby increasing processing rate.

The apparatus according to the present invention may further comprise within the chamber a second substrate holding means for holding a second substrate within the reaction region so that the second substrate faces the substrate, the substrate functioning as a counter electrode. In this constitution, two substrate can be simultaneously processed. Therefore, throughput of the process can be improved.

The apparatus according to the present invention may further comprise a second gas introducing means, each of the means for introducing gas and the second gas introducing means having respective flow rate adjusting means for separately adjusting gas flow rates. By separately adjusting gas flow rates, the pressures within the intermediate region and the reaction region can be separately adjusted. In addition, the pressure difference between these regions and the flow rate through the conductance regulating means can be balanced to a desired levels. Further, when highly reactive gas is included in the reaction gases used in the process, the highly reactive gas is directly introduced to the reaction region through the second introducing means, without the highly reactive gas contacting the conductance regulating means. Therefore, the processing rate is improved while the creation of the contaminant particles from the conductance regulating means is avoided.

In the apparatus according to the present invention the means for guiding the electromagnetic wave may be a microwave application means, the microwave application means having a microwave applicator, the microwave applicator being disposed to cover the bell jar. This constitution allow to simplify the processing apparatus employing microwave.

The apparatus according to the present invention may further comprise a means for moving the microwave applicator relative to the substrate. The moving of substrate relative to the electric field created by microwave allows to carry out uniform processing over the surface of the large area substrate.

The apparatus according to the present invention may further comprise a means for varying a dimension of the microwave applicator to carry out optimizing the matching of microwave and adjusting the mode of microwave. Alternatively, in the apparatus according to the present invention, the microwave applicator may have a specified dimension and geometry being designed to create a desired electric filed in the vicinity of the substrate, the dimension and geometry being determined by a numerical simulation of the electromagnetic field within the microwave applicator. The matching of and the mode adjusting of microwave can be optimized by varying a dimension of the microwave applicator, without creating standing wave within the wave guiding means. Further, such optimization can be achieved by the numerical simulation of the electromagnetic field within microwave applicator, so that the optimum microwave applicator having the optimized matching and the mode adjustment can be designed.

In the apparatus according to the present invention, a gas passage of the gas introduced from the means for introducing gas may be defined by the bell jar and the cylinder and communicates through the conductance regulating window, wherein the gas is heated when the gas passes through the passage, while the bell jar, the cylinder and the conductance regulating means are cooled with the gas.

In this constitution, the gas flow through the passage allows to heat the gas to a preferable temperature, while the bell jar, the cylinder and the conductance regulating means are cooled with the gas. Therefore, processing rate can be increased, while the overheating of the apparatus is avoided.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 24A, 24B and 24C are the graph illustratings the distributions of the electric field strength within the cylindrical cavity resonator having radius of 190 mm, for $TM_{012}$ mode (24A), $TM_{112}$ mode (24B), and $TM_{022}$ mode (24C), respectively;

DESCRIPTION OF THE PREFERRED EMBODIMENTS

The apparatus of the present invention will be described below in more detail with reference to the accompanying drawings.

Figure 1A:
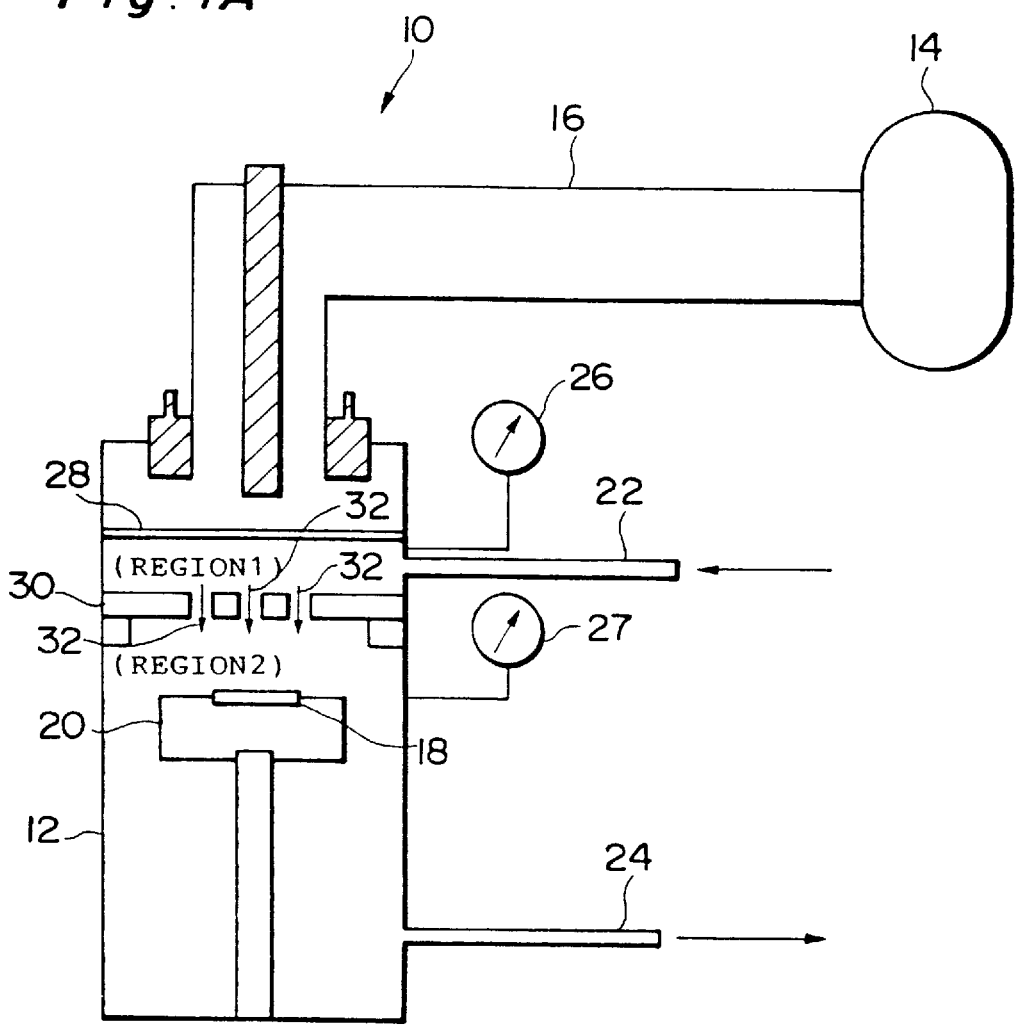
FIG. 1A is a sectional view of a differential pressure microwave plasma jet apparatus of the present invention.

FIG. 1A is a sectional view of a differential pressure microwave plasma jet apparatus according to the present invention. The arrangement of the present invention will be described below in detail with reference to this differential pressure microwave plasma jet apparatus.

As shown in FIG. 1A, a differential pressure microwave plasma jet apparatus 10 comprises a cylindrical reaction chamber 12 for processing a substrate, and a microwave source 14 for generating a microwave. The microwave source 14 is connected to the reaction chamber 12 through a wave guide 16, so that the microwave is guided to the reaction chamber 12. The interior of the reaction chamber 12 is divided, by a conductance regulating window (conductance regulating means) 30, into a reaction region (reaction room) indicated as a region 2 in FIG. 1 and an intermediate or interposed region (intermediate or interposed room) indicated as a region 1. A substrate holder 20 for holding a substrate 18 is set in the reaction region.

As shown in FIG. 1A, a gas supply tube 22 for supplying a plasma gas is connected to the intermediate room of the reaction chamber. The flow rate of the gas to be guided through the gas supply tube 22 is adjustable. The flow rate can be easily changed using a conventional gas flow rate adjustment means such as a variable valve. The reaction room has a gas exhaust tube 24 for exhausting the consumed gas. The flow rate of the exhaust gas from the gas exhaust tube 24 can also be easily adjusted using a conventional exhaust means with a flow rate adjustment function such as a vacuum pump. An intermediate room pressure detection pressure gage 26 is connected to the intermediate room to detect the pressure in the intermediate room. Similarly, a reaction room pressure detection pressure gage 27 is connected to the reaction room to detect the pressure in the reaction room.

That is, the differential pressure microwave plasma jet apparatus 10 can adjust the pressures in the intermediate and reaction rooms to desired values by adjusting the gas supply and exhaust amounts while detecting the pressures in the intermediate and reaction rooms.

As shown in FIG. 1A, the interior of the reaction chamber 12 is divided by a disk-like vacuum window (entrance window) 28 and the disk-like conductance regulating window (conductance regulating means) 30 having throughholes. More specifically, the first characteristic feature of the apparatus of the present invention is that the two windows, i.e., the vacuum window 28 on which the atmospheric pressure acts and the conductance regulating window 30 for shielding the plasma and adjusting the conductance of the gas in the reaction chamber 12 are arranged.

In the conventional processing apparatus using a microwave or an RF, i.e., the microwave plasma CVD apparatus or the RF plasma CVD apparatus, the region where a plasma is generated is in contact with the window on which the atmospheric pressure acts, so that the window is exposed to not only a stress due to the atmospheric pressure but also heating and sputtering by the plasma. Therefore, the window may be damaged at any time.

The apparatus of the present invention is characterized in that the intermediate or interposed room (a space indicated as (region 1) in FIG. 1A) having a high gas pressure for preventing plasma generation is arranged between the window on which the atmospheric pressure acts (vacuum window 28 in FIG. 1A) and the window for adjusting the gas flow (conductance window 30), thereby separating the plasma from the window on which the atmospheric pressure acts.

Figure 2:
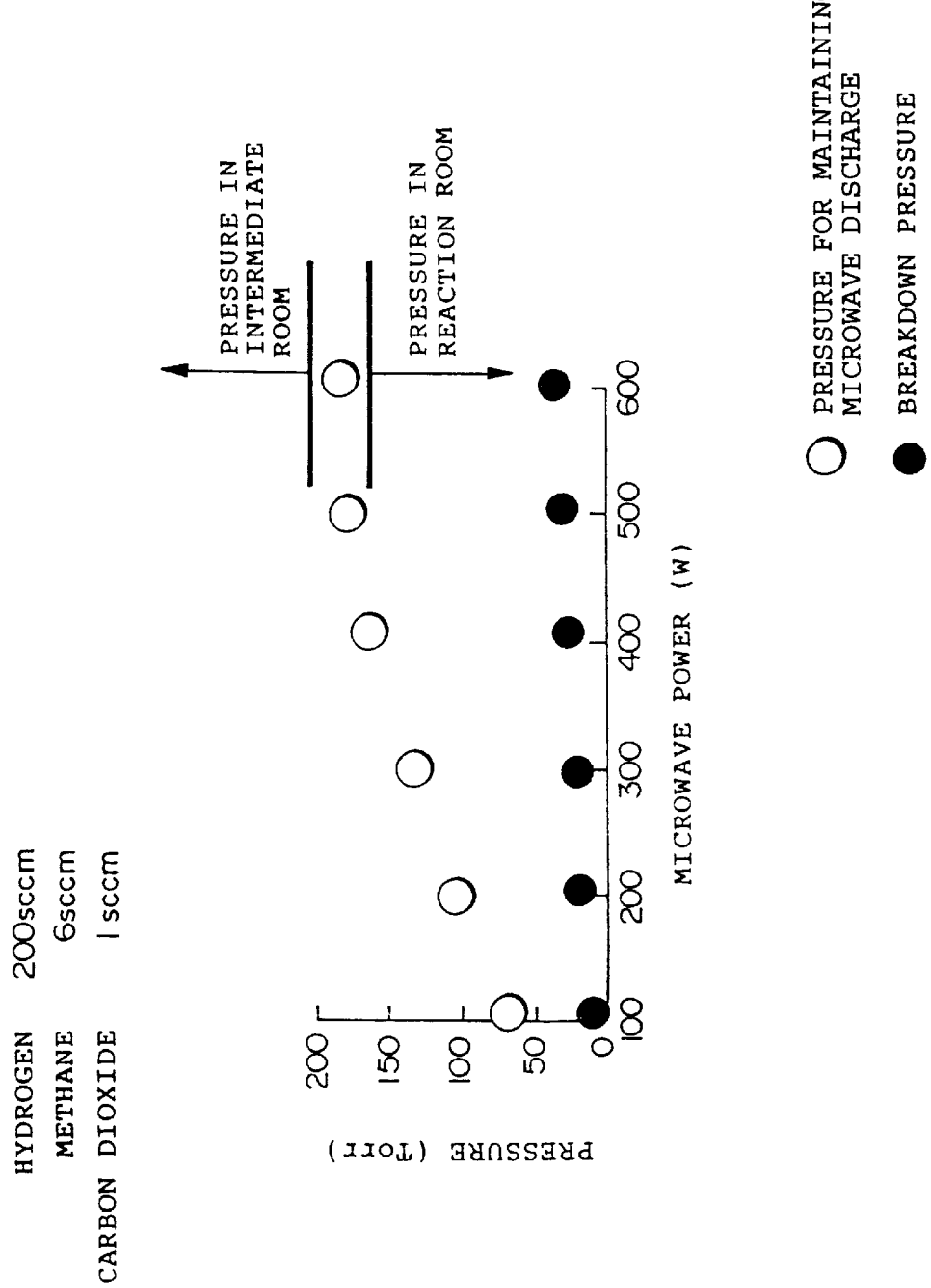
FIG. 2 is a graph showing the relationship between a microwave power and a breakdown pressure or a pressure for maintaining microwave discharge.

The operational principle of the apparatus of the present invention will be described below in detail with reference to FIG. 2. FIG. 2 is a graph showing the dependency of a breakdown pressure and pressure for maintaining microwave discharge of the apparatus of the present invention on a microwave power. Data shown in FIG. 2 was obtained when a reactive gas consisting of hydrogen at 200 sccm, methane at 6 sccm, and carbon dioxide at 1 sccm was used. The breakdown pressure is a maximum pressure for starting discharge with respect to a predetermined microwave power. In other words, discharge cannot be started at a pressure higher than the breakdown pressure. The pressure for maintaining microwave discharge is a maximum pressure for maintaining discharge with respect to a predetermined microwave power. In other words, discharge cannot be maintained at a pressure higher than the pressure for maintaining microwave discharge.

The data shown in the graph of FIG. 2 was measured in the following manner. While a predetermined microwave power was being applied, the reaction chamber was set at a high pressure in a non-discharge state (i.e., in a state without plasma). The pressure was gradually lowered. A pressure at which discharge started was measured as the breakdown pressure. Subsequently, the pressure was raised in the discharge state. A pressure at which discharge stopped was measured as the pressure for maintaining microwave discharge. Measurement was performed while changing the microwave power from 100 W to 600 W, thereby obtaining the graph of FIG. 2.

As shown in FIG. 2, the breakdown pressures with respect to the respective microwave powers are lower than the pressure for maintaining microwave discharges. More specifically, once discharge is started in the reaction chamber, collision ionization of high-density charged particles (ions and electrons) occurs, and discharge is maintained even at a high pressure. However, to start discharge when charged particles are rarely present (i.e., when no plasma is present), the charged particles must be sufficiently accelerated at a relatively low pressure and collided with the neutral gas. For this reason, the breakdown pressure is lower than the pressure for maintaining microwave discharge.

The apparatus of the present invention uses this difference between the breakdown pressure and the pressure for maintaining microwave discharge. The differential pressure microwave plasma jet apparatus shown in FIG. 1A will be described. This apparatus 10 has, in the reaction chamber 12, the intermediate room (region 1) and the reaction room (region 2) shown in FIG. 1A. The intermediate room is set at a pressure higher than the pressure for maintaining microwave discharge, and the reaction room is set at a pressure lower than the pressure for maintaining microwave discharge. With this pressure setting, plasma generation in the intermediate room is prevented. In the reaction room, once plasma ignition occurs, the plasma is stably maintained.

With this arrangement, the apparatus of the present invention suppresses plasma generation near the antenna, unlike the apparatus described in, i.e., Japanese Patent Publication No. 7-11995. In addition, unlike the apparatus described in Japanese Patent Publication No. 7-54758, no magnetic field need be applied.

Plasma control of the apparatus of the present invention will be described below. Plasma control is performed using parameters including an electric field, a gas flow, and a pressure, which are described in, e.g., Ryohei Itaya, "Reactive Plasma Control and Precision Plasma Process", Applied Physics, vol. 64, p. 526 (1995). The apparatus of the present invention positively uses a pressure distribution formed in the apparatus, thereby performing plasma control.

Plasma control using a pressure difference is performed in the following manner. A breakdown pressure with respect to a given electric field is described in accordance with the Paschen's law, as described in Grill, A., "Cold Plasma in Materials Fabrication", IEEE Press, New York, USA, p. 26 (1993). More specifically, a breakdown field Eb is represented as follows:

$$Eb = \frac{C_1 P}{C_2 + \ln(Pd)} \quad (1)$$

Eb: breakdown field
P: pressure
d: inter-electrodes distance
$C_1$, $C_2$: constant depending on the gas type When P is large, $$Eb = \frac{C_1 P}{C_2 + \ln(Pd)} < \frac{C_1}{C_2} P \quad (2)$$

In the microwave discharge apparatus, the inter-electrodes distance and electric field as parameters for applying the Paschen's law cannot be specified, unlike a DC discharge apparatus. Qualitatively, however, these parameters are set in accordance with this law.

The breakdown in microwave discharge is somewhat complex physical phenomenon, so that the breakdown condition in microwave discharge can not be simply given as Paschen's law for DC discharge. This is described in, for example, Roth, J. R., "Industrial Plasma Engineering, Volume 1: Principles", Institute of Physics Publishing Ltd., Bristol, UK (1995), pp. 485 to 500. However, as described in Roth reference, the breakdown microwave electric field as a function of the pressure can be approximately obtained, on the assumption that an individual electron must absorb enough energy from the electric field, between collisions, to ionize the neutral gas. At higher pressure of about 100 torr or higher, this assumption gives the approximation between breakdown field and pressure, in which breakdown field is almost proportional to the pressure. That is, the approximation provides similar tendency as Paschen's law. Similarly, at lower pressure than about 10 Torr, the assumption also provides the approximation in which breakdown field is almost inverse-proportional to the pressure. That is, the approximation for lower pressure also provides similar tendency as Paschen's law. Further, in Roth, experimental results using helium with a admixture of mercury (Heg gas) also show similar tendency, at a microwave frequency and power, as Paschen's law provides (e.g., pp. 492, FIGS. 13 and 17).

It may be possible to approximately apply Paschen's law to prevent the plasma formation in the intermediate room, by significantly decreasing the pressure within the intermediate room to much lower pressure than the reaction room pressure, as conducted in experiments in Japanese Patent Application Laid-Open No. 5-166596. Nevertheless, the present invention is directed to prevent the plasma formation in the intermediate room, by increasing the pressure within the intermediate room to higher pressure than the reaction room pressure.

One of the object of the present invention is to provide useful processing apparatus for the use in deposition or etching of hard/refractory materials comprising elements in the 2nd and 3rd periods of the periodic table, such as diamond, boron nitride (BN), silicon carbide (SiC), silicon nitride (SiN), carbon nitride (CN) and aluminum nitride (AlN). Such hard/refractory materials have higher bond energy, because of smaller atomic radius. Therefore, synthesis of these materials requires the processing within higher-density/higher-energy plasma, and preferable pressure is at least 1 Torr, and more preferably 40 Torr or higher. Therefore, higher pressure in the intermediate room is advantageous than lower pressure, for the deposition of the hard/refractory materials. For example, the plasma formation in the intermediate room can be prevented when the intermediate room pressure is from about 60 Torr to about 200 Torr, as can be seen in FIG. 2. Further, reaction gas flows can be created from the intermediate room to the reaction room as described later, by an appropriate negative pressure gradient from the intermediate room to the reaction room. Also, in such pressure gradient, reaction gas introduced into the intermediate room is not directly evacuated, but evacuated through the reaction room, unlike the experiments in Japanese Patent Application Laid-Open No. 5-166596. Thus, the apparatus according to the present invention can provide significantly higher reaction gas consumption efficiency.

FIG. 2 shows pressure for microwave discharge ("the breakdown pressure" and "the pressure for maintaining microwave discharge") in methane-hydrogen reaction gases at various microwave power. More specifically, in the case where a methane and hydrogen gases are used and a pressure of 200 Torr or higher is set, a microwave power of several hundreds Watts is required to breaking-down and maintaining microwave discharge, unless an electrode for concentrating the electric field is used. In other words, when the pressure in the intermediate room (region 1 in FIG. 1A) is maintained at 200 Torr or higher, plasma generation in the intermediate room can be prevented, as is seen from FIG. 2.

As shown in FIG. 2, when the microwave power is high (i.e., when a high field strength exist), both the breakdown pressure and the pressure for maintaining microwave discharge become high. However, the relationship between the field strength and the microwave power is represented such that the microwave power is proportional to the square of electric field. Consequently, even when the microwave power is increased to ten times, the field strength only increases to about $10^{1/2}$ times. On the basis of the Paschen's law for microwave discharge, when the pressure P is high, the term of first order of the numerator is dominant to the term of logarithm of the denominator in equation (1). The breakdown voltage (field strength for breakingdown) can be estimated to be smaller than a value proportional to the pressure, as represented by equation (2). Therefore, for example, when the microwave power is increased to ten times of the previous power, the breakdown pressure merely increases to about $10^{1/2}$. A similar tendency can be applied to the pressure for maintaining microwave discharge.

The pressure range for the intermediate room of the present invention changes depending on the electric field to be applied. In examples to be described later, when the microwave power is about 100 W, a pressure of about 100 Torr suffices for the intermediate room. When the microwave power is increased, a pressure of 200 Torr or more is required to prevent plasma generation in the intermediate room. To obtain a strong plasma jet flow(to be described later), the pressure difference between the intermediate room and the reaction room should be large. However, as described in the following embodiments, when the pressure in the intermediate room is raised to 2 atom (1,520 Torr) or higher, fixing of the window of the apparatus becomes difficult to an impractical degree.

Even when plasma formation was performed by guiding a RF electromagnetic wave to the reaction chamber, similar relationship as shown in the graph of FIG. 2 was established between the pressure for maintaining microwave discharge and the breakdown pressure.

As described before, one of the objects of the present invention is to provide processing apparatus useful for deposition of hard/refractory materials. Higher temperature/higher pressure plasma is required for the deposition process of such materials at higher deposition rate. However, such plasma has a tendency to cause the local temperature elevation within plasma, thereby enhancing the damage of the microwave entrance window. The present invention can provide a solution to this problem, by providing intermediate room within the reaction chamber, to locate the plasma away from the microwave entrance window, thereby allowing plasma processing with higher temperature/higher pressure plasma without damaging the microwave entrance window.

In this constitution of the apparatus according to the present invention, conductance regulating window is exposed to plasma, and the microwave entrance window is not exposed to plasma. The entrance window is subject to a pressure difference between outside the chamber (typically atmospheric pressure) and inside the chamber (typically several tens Torr to about 200 Torr). Thus, a large pressure difference, i.e., a large stress is exerted onto the entrance window. The exposing of the stressed entrance window to higher temperature/higher density plasma may cause serious damage on the window surface, thereby breaking the entrance window. In the constitution of the apparatus according to the present invention, pressure difference through two sides of the conductance regulating window is relatively small, so that the users are not necessary to consider damaging of the conductance regulation window.

The second characteristic feature of the apparatus of the present invention is that, as shown in FIG. 1A, a plasma jet is formed in the reaction chamber through the conductance regulating window 30 which partitions the intermediate room (region 1 in FIG. 1A) and the reaction room (region 2 in FIG. 1A) of the gas.

With this arrangement, the plasma formed in the reaction room (region 2) is separated from the conductance regulating window 30, so sputtering of the conductance regulating window 30 by the plasma can be minimized.

The third characteristic feature of the apparatus of the present invention is as follows. Because of the differential pressure between the intermediate room (region 1) and the reaction room (region 2), the non-uniformity of the plasma caused by the field distribution in the reaction room is compensated by the gas flow (indicated by an arrow 32 in FIG. 1A) supplied toward the reaction room side through the conductance regulating window 30, thereby eliminating the film thickness distribution in the substrate.

Figure 1B:
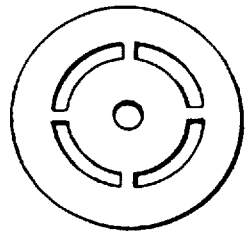
FIG. 1B is a plan view of a conductance regulating window.

FIG. 1B is a plan view of the conductance regulating window 30. To form a gas flow in the reaction room to compensate the non-uniformity of the plasma caused by the field distribution of the microwave, the sizes and positions of holes formed in the conductance regulating window 30 must be adjusted. For example, when a microwave of 2.45 GHz is to be used, the node and loop of the electric field are formed within the range of 1/4-wavelength (about 3 cm) in a free space. This field distribution can be minimized by design of the apparatus, though the field distribution cannot be completely eliminated. Therefore, when the gas supply holes are adjusted in correspondence with the magnitude of the electric field, the plasma distribution on the substrate surface can be minimized.

Here, an example of how to design the suitable conductance regulating window for maintaining a constant pressure difference between the intermediate room and the reaction room, and for suitably flowing gases from the intermediate room to the reaction room, will be described below. As shown in FIG. 1, gas flow 32 from the intermediate room (REGION 1) to the reaction room (REGION 2), and the pressure difference between these rooms, can be determined by: gas flow from gas supply tube 22 into the intermediate room; gas exhaust from the reaction room via gas exhaust tube 24; and conductance from the intermediate room to the reaction room via conductance regulating window 30.

Figure 10:
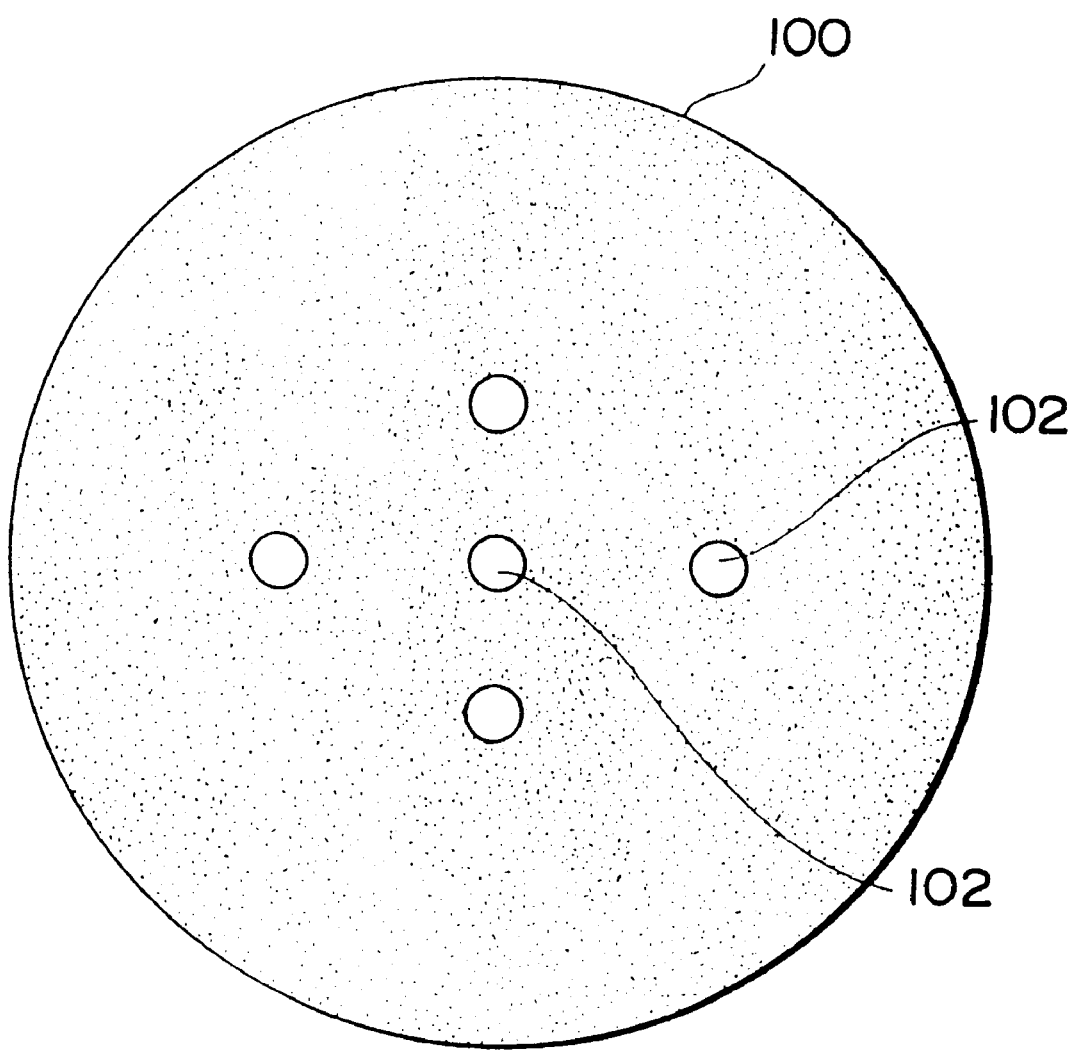
FIG. 10 is a plan view of a preferable conductance regulating window for the use in the present invention.
Figure 11:
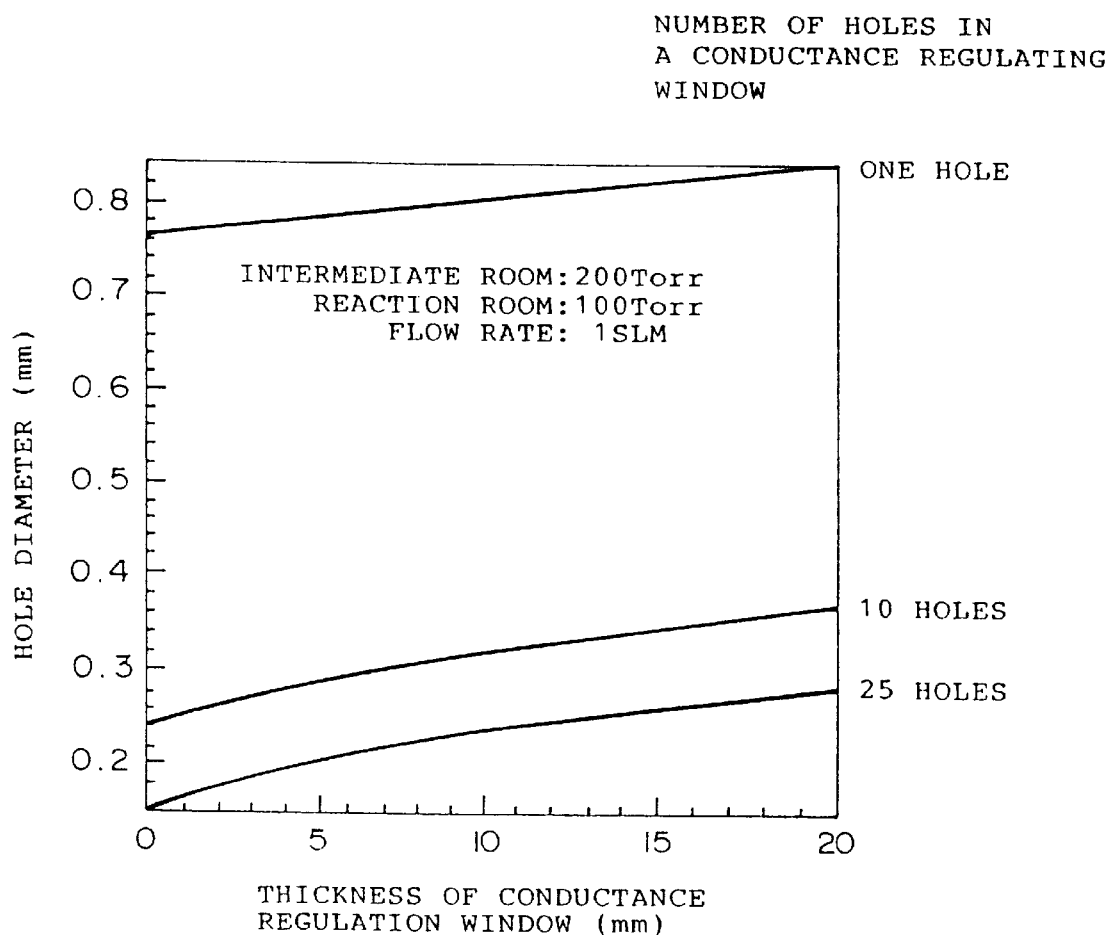
FIG. 11 is a graph showing relationship between the diameter of the opening and the thickness of the conductance regulating window, for providing desired flow rate through the window at a chamber pressure condition.

FIG. 10 schematically illustrates an example of the conductance regulating window. A suitable example of conductance regulating window 100 for the processing apparatus according to the present invention as shown in FIG. 10 is a planar disc, and is provided with through holes 102 around the center of the disc. The relationship of the number of through holes in such conductance regulating window with flow rate through the conductance regulating window was evaluated. In the processing apparatus shown in FIG. 1, combinations of hole diameter and window thickness for establishing gas flow having flow rate of 1 SLM (standard liter per minute) through the window, was obtained, in the case where the intermediate room pressure is 200 Torr and the reaction room pressure is 100 Torr (pressure difference is 100 Torr). The result is shown in the graph of FIG. 11.

In the present evaluation, 3 types of conductance regulating windows having 1 hole, 10 holes and 25 holes, respectively, were used to evaluate the relationship of hole diameter and window thickness for establishing gas flow having constant flow rate at predetermined pressure conditions. Desirable pressure conditions for specific process is given by the breakdown pressure and the pressure for maintaining microwave discharge according to the invention, as described above. Therefore, the preferred design for the conductance regulating window, for locating plasma away from the microwave entrance window and distributing plasma around the substrate, can be carried out.

A relationship of conductance C with flow rate (Pa·m³·s⁻¹) and pressure of one side $P_1$ (Pa) and another side $P_2$ (Pa), can be given for the processing chamber according to the invention, assuming relatively short cylindrical vessel having diameter d and length l, as following modified Poiseuille equation:

$$C = 1349 \times \frac{d^4}{l + 0.029Q} \cdot \frac{P_1 + P_2}{2}$$

Desirable conductance C for desirable pressure conditions and flow rate can be obtained by using above equation. The desirable design of the conductance regulation window for the desirable conductance C can be accomplished by carrying out a simple experiment as shown above.

Examples of the present invention will be described below with reference to the accompanying drawings. The same reference numerals denote the same elements throughout the drawings, and a detailed description thereof will be omitted.

EXAMPLE 1

Figure 3:
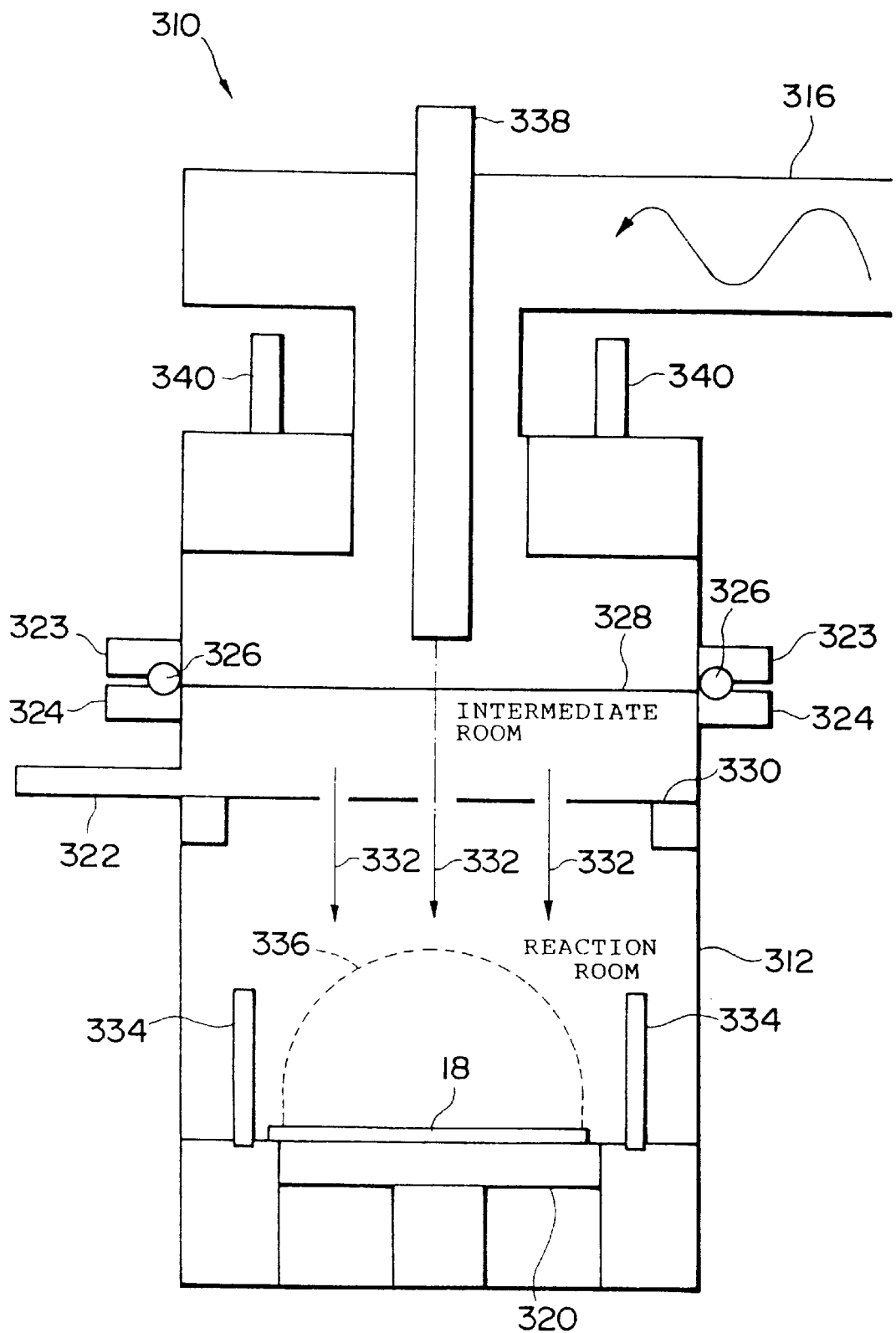
FIG. 3 is a sectional view of a differential pressure microwave plasma jet apparatus used in Example 1.

FIG. 3 is a sectional view of a differential pressure microwave plasma jet apparatus according to the present invention. In Example 1, a diamond film was formed on an Si substrate by using the apparatus shown in FIG. 3.

As shown in FIG. 3, a differential pressure microwave plasma jet apparatus 310 used in this embodiment comprises a reaction chamber 312, and a wave guide 316 for guiding a microwave from a microwave source (not shown) to the reaction chamber 312. A substrate holder 320 for supporting a substrate 18 is arranged in the reaction chamber 312.

As shown in FIG. 3, the reaction chamber 312 is divided into upper and lower sections by flanges 323 and 324. In assembling the reaction chamber 312, a vacuum window 328 consisting of quartz and an O-ring 326 are set at the junction portion between the flanges 323 and 324. The interior of the reaction chamber 312 is further divided into a reaction room and an intermediate room by arranging a conductance regulating window 330 ($\epsilon r=3.75$) consisting of quartz and having through-holes. The conductance regulating window 330 has through-holes as shown in FIG. 1B. A gas supply tube 322 for introducing a gas for forming a plasma is connected to the intermediate room. An exhaust tube (not shown) for exhausting the gas is arranged at the lower portion of the reaction room, so that the consumed gas in the reaction room is exhausted from the reaction room of the reaction chamber.

Since the pressure in the intermediate room is set to be higher than that in the reaction room, the gas blows off as a flow indicated by an arrow 332 from the intermediate room to the reaction room side through the conductance regulating window 330. A quartz cylinder 334 for controlling the gas flow is arranged around the substrate 18. When a microwave is guided after a gas having a predetermined composition is supplied, and the pressure reaches a predetermined value, a plasma is generated above the substrate, as indicated by a dotted line 336. More specifically, the gas blowing off from the conductance regulating window 330 as indicated by the arrow 332 is excited by the electric field of the microwave to generate the plasma, as indicated by the dotted line 336, so that diamond is grown on the substrate. Note that the dotted line 336 does not always indicate the isopycnic curve of the plasma.

As shown in FIG. 3, to finely adjust the position of the plasma generated in the reaction room of the reaction chamber 312, a coaxial level adjustment knob 338 for adjusting the level of the coaxial antenna, and a terminal plate level adjustment knob 340 for adjusting the level of the terminal plate on the antenna side are arranged at the upper portion of the reaction chamber.

In Example 1, diamond was grown with the following process. First, the pressure in the intermediate or interposed room between the vacuum window 328 and the conductance regulating window 330 was set to be 300 Torr. The pressure of 300 Torr is higher than the plasma maintenance pressure under the conditions of the gas composition and microwave power of this embodiment. Therefore, no plasma is formed in the intermediate room.

The diamond growth conditions of Example 1 were as follows:

Hydrogen ($H_2$) volume flow rate: 1 (SLM)
Methane ($CH_4$) volume flow rate: 0.03 (SLM)
Carbon dioxide ($CO_2$) volume flow rate: 0.01 (SLM)
Pressure in reaction room: 100 (Torr)
Microwave frequency: 2.45 (GHz)
Microwave power: 7 (kW)
Substrate temperature: 1,000 (° C.)
(SLM: Standard Liter per Minute)

Under these conditions, a diamond film could be formed on an Si substrate having a diameter of 4 inches (about 101.6 mm) at a growth rate of 3 μm/hr. When the through-holes (holes) of the conductance regulating window 330 were optimized, variations in diamond film thickness in the 4"-diameter substrate surface after 100-hour growth fell within 5%. That is, diamond film formation was continuously stably performed for a long time of 100 hours. After film formation, the Si substrate was dissolved with fluoric and nitric acids, thereby obtaining an self-standing diamond film. This film exhibited a transmittance of 71% from the infrared range to the ultraviolet range, which was close to the theoretical transmittance. Therefore, it was found that this self-standing diamond film had excellent properties as a window material.

To compare the result of Example 1 with that obtained by the prior art, a microwave plasma CVD apparatus 350 having a reaction chamber 352 without any conductance regulating window was used to form a diamond film on a 4"-diameter Si substrate under the same conditions.

Figure 4:
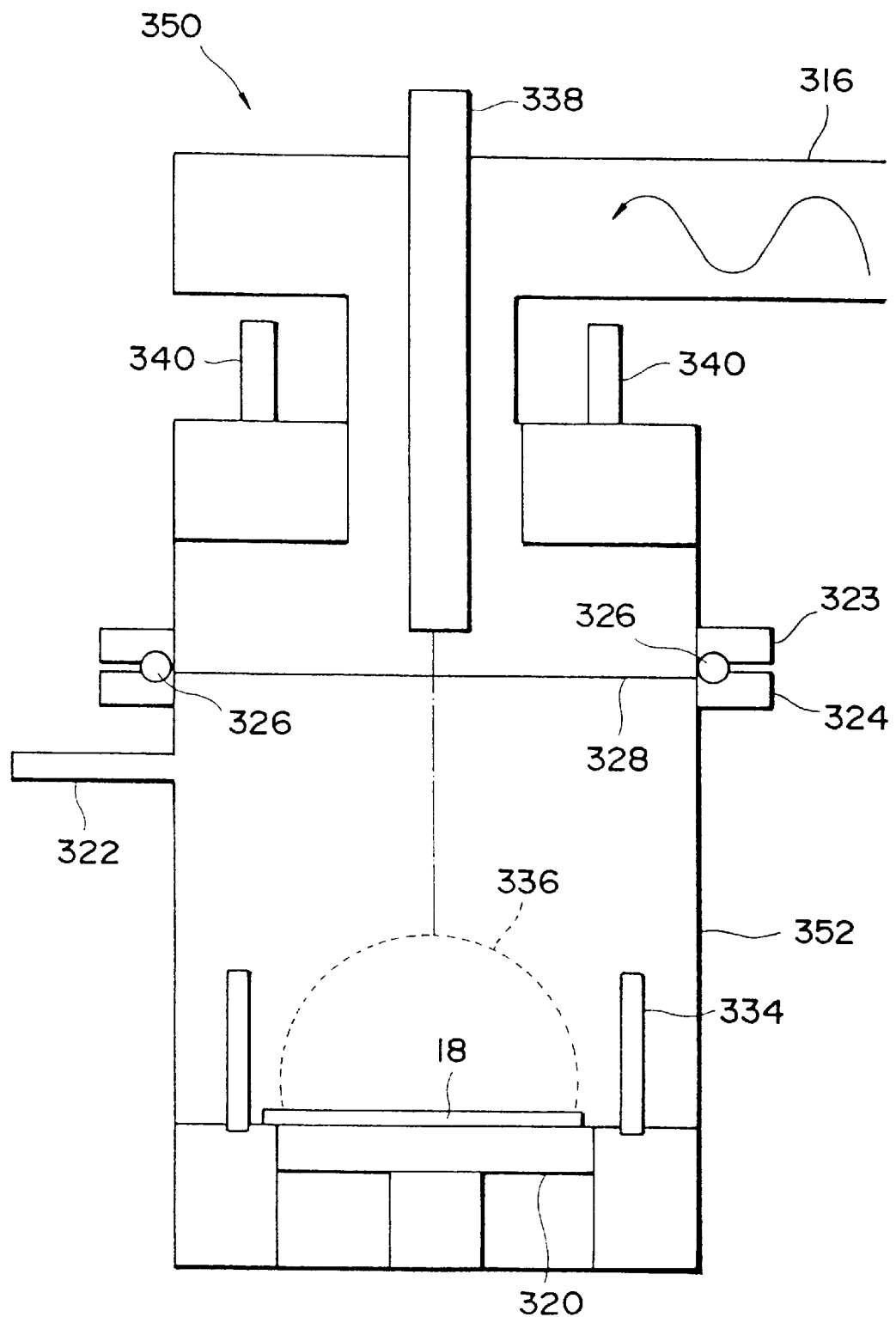
FIG. 4 is a sectional view of a conventional microwave plasma CVD apparatus used in the comparative example of Example 1.

FIG. 4 is a sectional view of the microwave plasma CVD apparatus 350 used in this comparative example. As shown in FIG. 4, the microwave plasma CVD apparatus 350 has the same arrangement as that of the differential pressure microwave plasma jet apparatus 310 shown in FIG. 3 except that the reaction chamber 352 has no conductance regulating window. More specifically, a remarkable difference from the differential pressure microwave plasma jet apparatus 310 is that no intermediate room is formed in the microwave plasma CVD apparatus 350, so that the vacuum window 328 is directly exposed to a generated plasma. In addition, the gas flow toward the substrate 18, as indicated by the arrow 332 in FIG. 3, is not formed in the reaction chamber 352 of the microwave plasma CVD apparatus 350.

Under the same diamond growth conditions as those of Example 1 using the differential pressure microwave plasma jet apparatus 310, diamond was grown on the substrate 18 in the reaction chamber 352 of the microwave plasma CVD apparatus 350.

The result obtained by this prior art will be compared with that obtained by Example 1 of the present invention. In the comparative example, the vacuum window 328 consisting of quartz was heated to a high temperature and sputtered because the vacuum window 328 is directly exposed to the plasma. For this reason, the vacuum window must be cleaned or exchanged every several ten hours. However, in Example 1, even after 100-hour film formation, no damage to the vacuum window was visually observed. In the comparative example, the O-ring 326 for fixing the vacuum window 328 was deformed. However, in Example 1, no deformation of the O-ring was observed. In Example 1, even after 100-hour film formation, no damage to the conductance regulating window 330 was observed with visual check.

In the comparative example, no gas flow through the conductance regulating window was formed. Therefore, the growth rate varied depending on positions on the substrate surface. The film thickness distribution after 100-hour film formation was 30%.

According to the present invention, the conductance regulating window is arranged in the reaction chamber to form the intermediate room. The plasma is stably formed in the reaction room while preventing plasma formation in the intermediate room by adjusting the pressures in the intermediate and reaction rooms. In addition, a gas flow from the intermediate room is formed in the reaction room. With this film formation process, the stability of film formation is largely increased, and damage to the vacuum window can be prevented.

EXAMPLE 2

In Example 2, a counter electrode is arranged in the reaction chamber of a differential pressure microwave plasma jet apparatus so as to be parallel to a substrate on which diamond is formed and perpendicular to an electric field. With this arrangement, the electric field formed in the reaction room of the reaction chamber can be concentrated between the counter electrode and the substrate, thereby averaging the field distribution.

Figure 5:
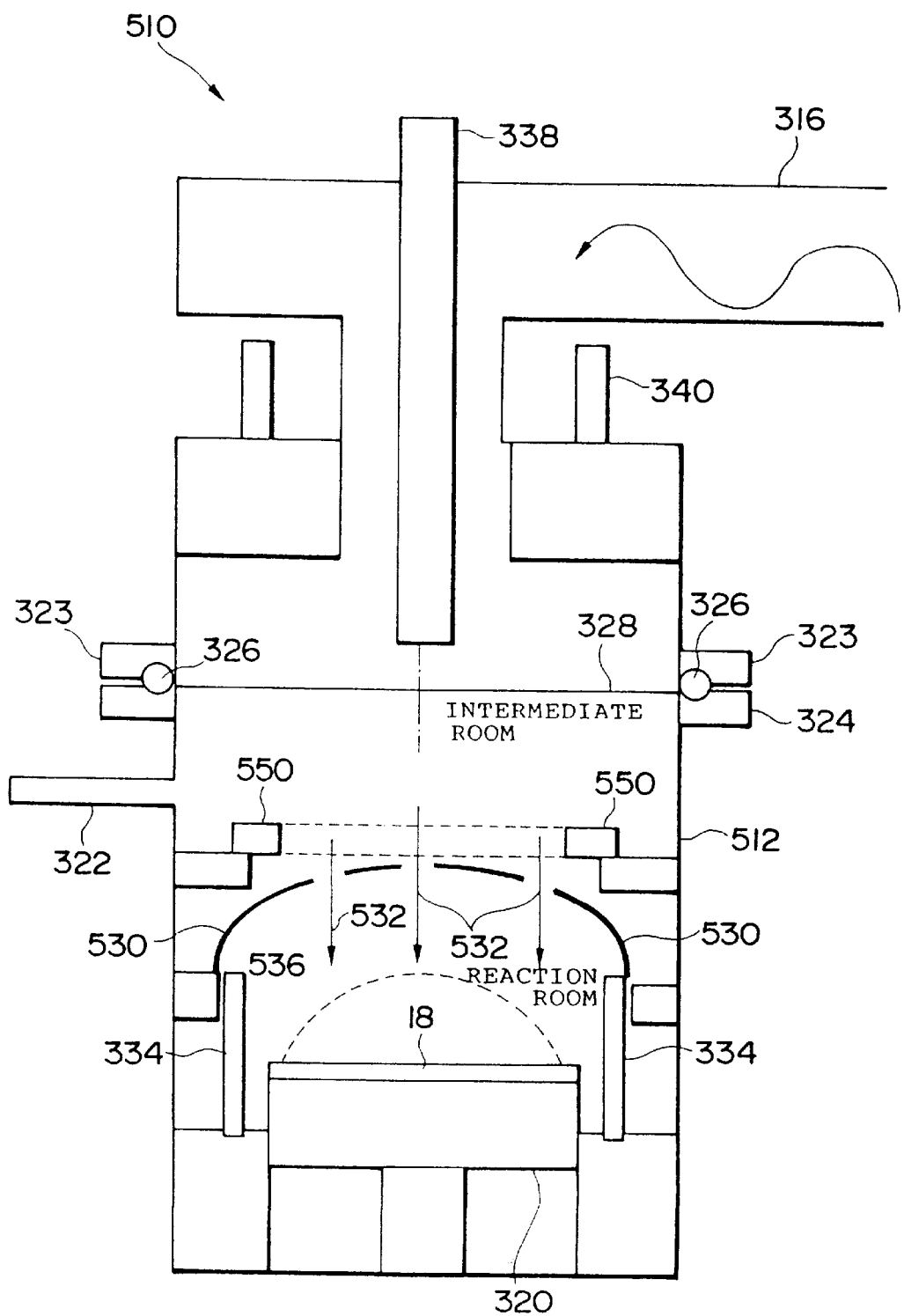
FIG. 5 is a sectional view of a differential pressure microwave plasma jet apparatus with a counter electrode used in Example 2.

FIG. 5 is a sectional view of a differential microwave plasma CVD apparatus 510 used in Example 2. As shown in FIG. 5, the differential microwave plasma CVD apparatus 510 used in Example 2 has the same arrangement as that of the differential pressure microwave plasma CVD apparatus 310 shown in FIG. 3 except that a ring-like opposed electrode 550 is arranged in a reaction chamber 512, and the conductance regulating window has a dome-like shape. The ring-like opposed electrode 550 is arranged in an intermediate room between a vacuum window 328 and a conductance regulating window 530. As in the Example 1, pressures in the intermediate and reaction rooms are set to form a gas flow from the through-holes of the dome-like conductance regulating window 530, as indicated by an arrow 532. The field distribution around a substrate 18 is averaged by the counter electrode 550, so that attenuation of electric field is suppressed. Consequently, as schematically indicated by a dotted line 536, the plasma can be concentrated and regulated.

Under the diamond growth conditions of Example 1, diamond film formation was performed. As a result, a growth rate of 4 $\mu$m/hr was achieved on a 4"-diameter Si substrate. Variations in film thickness after 100-hour film formation fell within 3% in the 4"-diameter substrate surface. As described above, uniform film formation was performed for a long time. As in Example 1, even after 100-hour film formation, no damage to the vacuum window 328 and the conductance regulating window 530 was visually observed.

EXAMPLE 3

Figure 6:
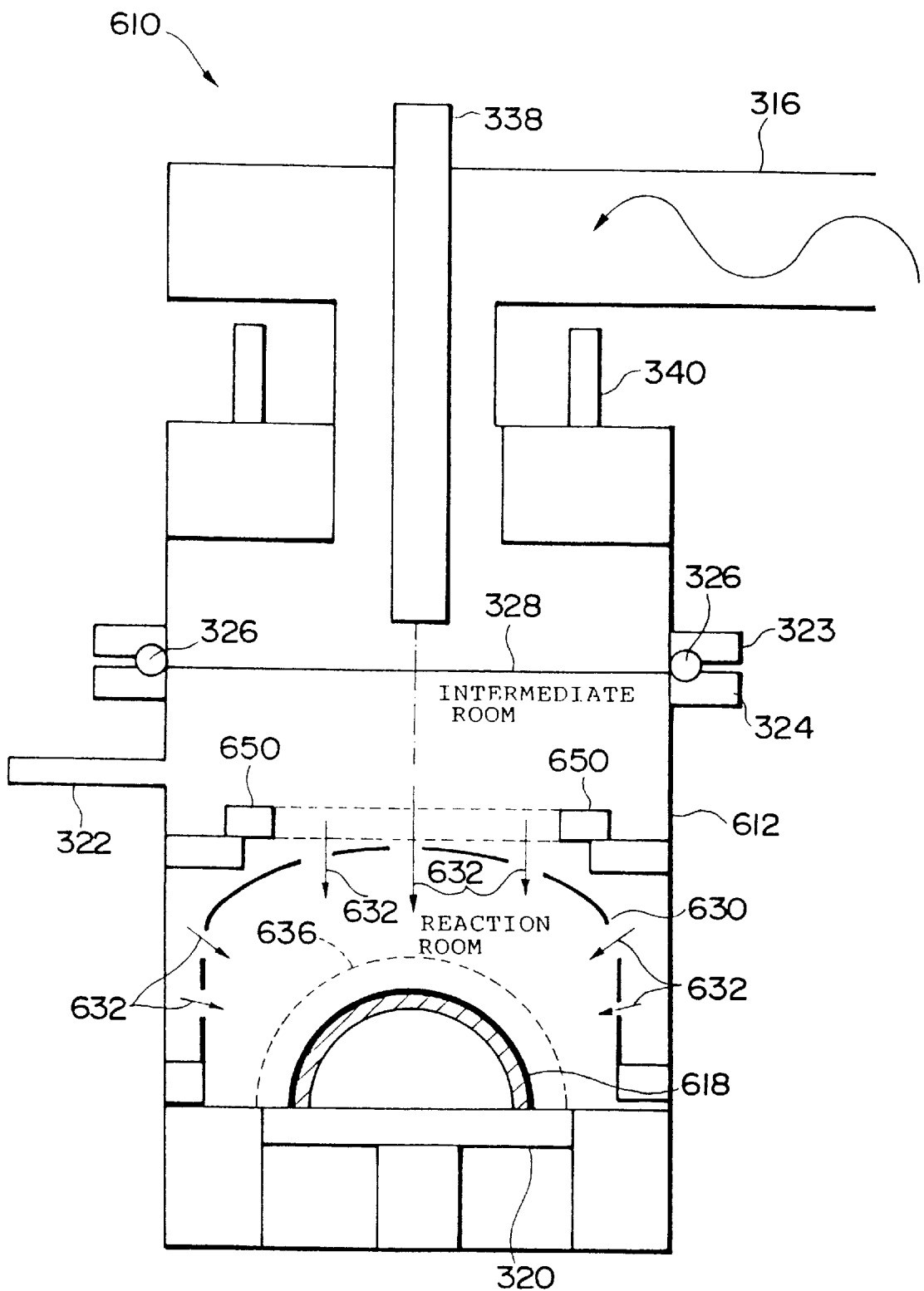
FIG. 6 is a sectional view of a differential pressure microwave plasma jet apparatus with a counter electrode used in Example 3.

In Example 3, diamond film formation using a differential pressure microwave plasma jet method, which is performed on a three-dimensional substrate (substrate) on which diamond is formed, will be described. FIG. 6 is a sectional view of a differential microwave plasma jet apparatus 610 with a counter electrode used in Example 3. As in Example 2, the differential microwave plasma jet apparatus 610 with a counter electrode of Example 3 has a counter electrode 650 in an intermediate room between a vacuum window 328 and a conductance regulating window 630. In the conductance regulating window 630, an Si substrate 618 having a three-dimensional shape is mounted on a holder 320. The Si substrate 618 has an Si dome-like shape having a radius of curvature of 4 cm. The shape of the conductance regulating window 630 is not similar to the dome-like shape of the Si substrate 618, though it has a relatively similar bell-jar-like shape. As compared to the plate-like conductance regulating window 330 shown in FIG. 3, the conductance regulating window 630 has a shape corresponding to the substrate. As in Examples 1 and 2, pressures in the intermediate and reaction rooms are adjusted to form a gas flow as indicated by an arrow 632. A plasma is generated around the Si substrate 618, as schematically indicated by a dotted line 636.

In Example 3, diamond was formed on the Si dome having a three-dimensional shape under the following diamond growth conditions:

Hydrogen ($H_2$) volume flow rate: 1 (SLM)

Methane ($CH_4$) volume flow rate: 0.03 (SLM)

Carbon dioxide ($CO_2$) volume flow rate: 0.01 (SLM)

Pressure in reaction room: 80 (Torr)

Microwave frequency: 2.45 (GHz)

Microwave power: 6 (kW)

Substrate temperature: 1,000 (° C.)

The growth time was two hours. In this diamond growth process, a growth rate of 2 $\mu$m/hr was achieved. The film thickness distribution on the entire dome Si substrate was 10%.

To compare this result with that obtained by the prior art, the apparatus shown in FIG. 4 was used to form diamond on the dome-like Si substrate 618 under the above-described conditions. However, the gas did not spread to the edge portion of the dome, so no diamond was formed at the edge portion.

In Example 3, therefore, diamond can be relatively uniformly grown even on a substrate having a three-dimensional shape by using the present invention. Example 3 can be variously changed and modified. For example, a cubic box-like conductance regulating window can also be used for a dome-like substrate as shown in FIG. 6. When the shape of the substrate is three-dimensional, the conductance regulating window to be used can also have a three-dimensional shape. However, to achieve a uniform film thickness or etching, the effect of the shape of the conductance regulating window corresponding to the substrate must be confirmed with experiments.

EXAMPLE 4

In Example 4, a differential pressure microwave plasma jet apparatus with a counter electrode and a conductive grid for shielding a microwave was used to grow diamond on an Si substrate.

Figure 7:
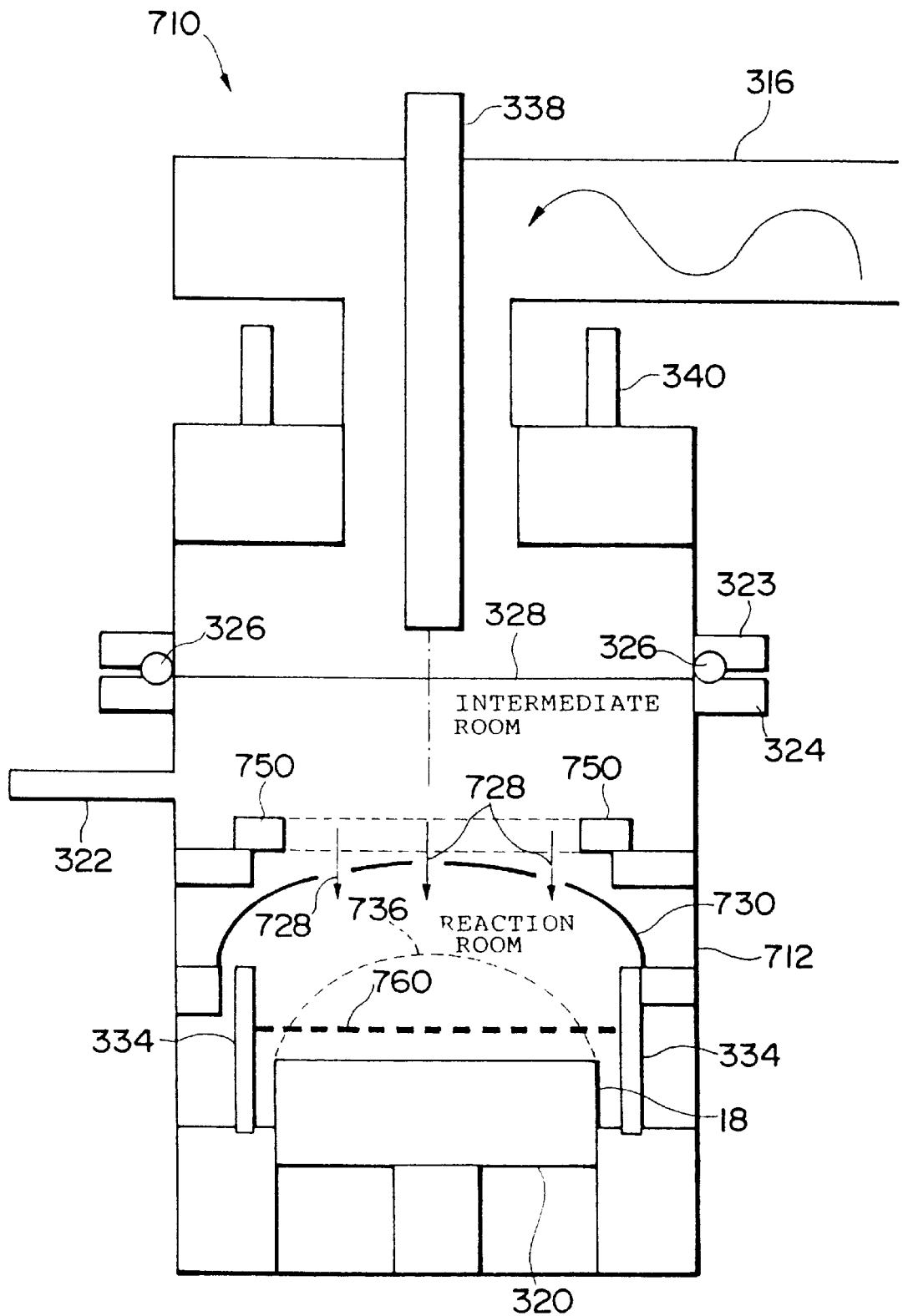
FIG. 7 is a sectional view of a differential pressure microwave plasma jet apparatus with a grid and a counter electrode used in Example 4.

FIG. 7 is a sectional view of a differential microwave plasma jet apparatus 710 with a grid and a counter electrode used in Example 4. A reaction chamber 712 of this differential pressure microwave plasma jet apparatus has a ring-like opposed electrode 750 arranged in an intermediate room between a vacuum window 328 and a conductance regulating window 730 consisting of quartz, and a conductive grid 760 arranged in a reaction room inside the conductance regulating window 730. The conductive grid 760 is constituted by a tantalum (Ta) filament having its surface coated with diamond.

In Example 4, diamond was formed on a 4"-diameter Si substrate under the following diamond growth conditions:

Hydrogen ($H_2$) volume flow rate: 500 (sccm)
Methane ($CH_4$) volume flow rate: 10 (sccm)
Carbon dioxide ($CO_2$) volume flow rate: 2 (sccm)
Pressure in reaction room: 60 (Torr)
Microwave frequency: 2.45 (GHz)
Microwave power: 3 (kW)
Substrate temperature: 300 (° C.) (sccm: Standard Cubic Centimeter per Minute)

In Example 4, the conductive grid 760 is arranged immediately above a substrate 18, so that the substrate 18 is prevented from being inductively heated by the microwave. As a result, a relatively high growth rate of 0.5 $\mu$m/hr was achieved in low-temperature synthesis at a low substrate temperature of 300° C.

As for the material of the conductive grid 760, it was found as a result of studies that a diamond- or graphite-coated grid was preferably used because inclusion of contaminants in the resultant diamond was minimized. It was also found that a refractory metal such as tantalum or tungsten coated with diamond or graphite was more preferably used.

EXAMPLE 5

In Example 5, the differential pressure microwave plasma jet apparatus with a counter electrode shown in FIG. 5 was used to etch diamond synthesized in Example 2. In etching, the pressure conditions of the intermediate and reaction rooms were adjusted to appropriately generate a plasma. Upon finding conditions for generating a plasma only in the reaction room and preventing plasma generation in the intermediate room, etching was performed under the following conditions:

Oxygen ($O_2$) volume flow rate: 500 (sccm)
Tetrafluorocarbon ($CF_4$) volume flow rate: 200 (sccm)
Pressure: 60 (Torr)
Microwave frequency: 2.45 (GHz)
Microwave power: 3 (kW)
Substrate temperature: 300 (° C.)

Under these conditions, diamond on a 4"-diameter substrate was etched. As the average etch rate on the entire 4"-diameter substrate, a high etch rate of 10 $\mu$m/hr could be achieved. Variations in etch rate in the surface fell within 3%. As in Example 2, even after etching, no damage to a vacuum window 328 and a conductance regulating window 530 was observed.

As described above, with the apparatus according to the present invention, an appropriate plasma can be generated only around the substrate, so that uniform and high-speed etching can be achieved.

EXAMPLE 6

In Example 6, the differential pressure microwave plasma jet apparatus with a counter electrode shown in FIG. 5 was used to synthesize hexagonal BN (c-BN) in a high-pressure phase.

The synthesis conditions of Example 6 were as follows:

Diborane ($B_2H_6$ diluted with 10% hydrogen) volume flow rate: 500 (sccm)
Ammonia ($NH_3$) volume flow rate: 500 (sccm)
Pressure: 100 (Torr)
Microwave frequency: 2.45 (GHz)
Microwave power: 5 (kW)
Substrate temperature: 300 (° C.)

Under these conditions, film formation on a 4"-diameter Si substrate was performed for ten hours. The film thickness after film formation was 11 $\mu$m. Upon analyzing the resultant film by using an X-ray and FTIR, it was found that c-BN having a zinc-blende crystalline structure was synthesized and formed on the Si substrate.

EXAMPLE 7

In Example 7, a radio frequency (RF) inductive coupling plasma jet apparatus was used to grow diamond on an Si substrate.

Figure 8:
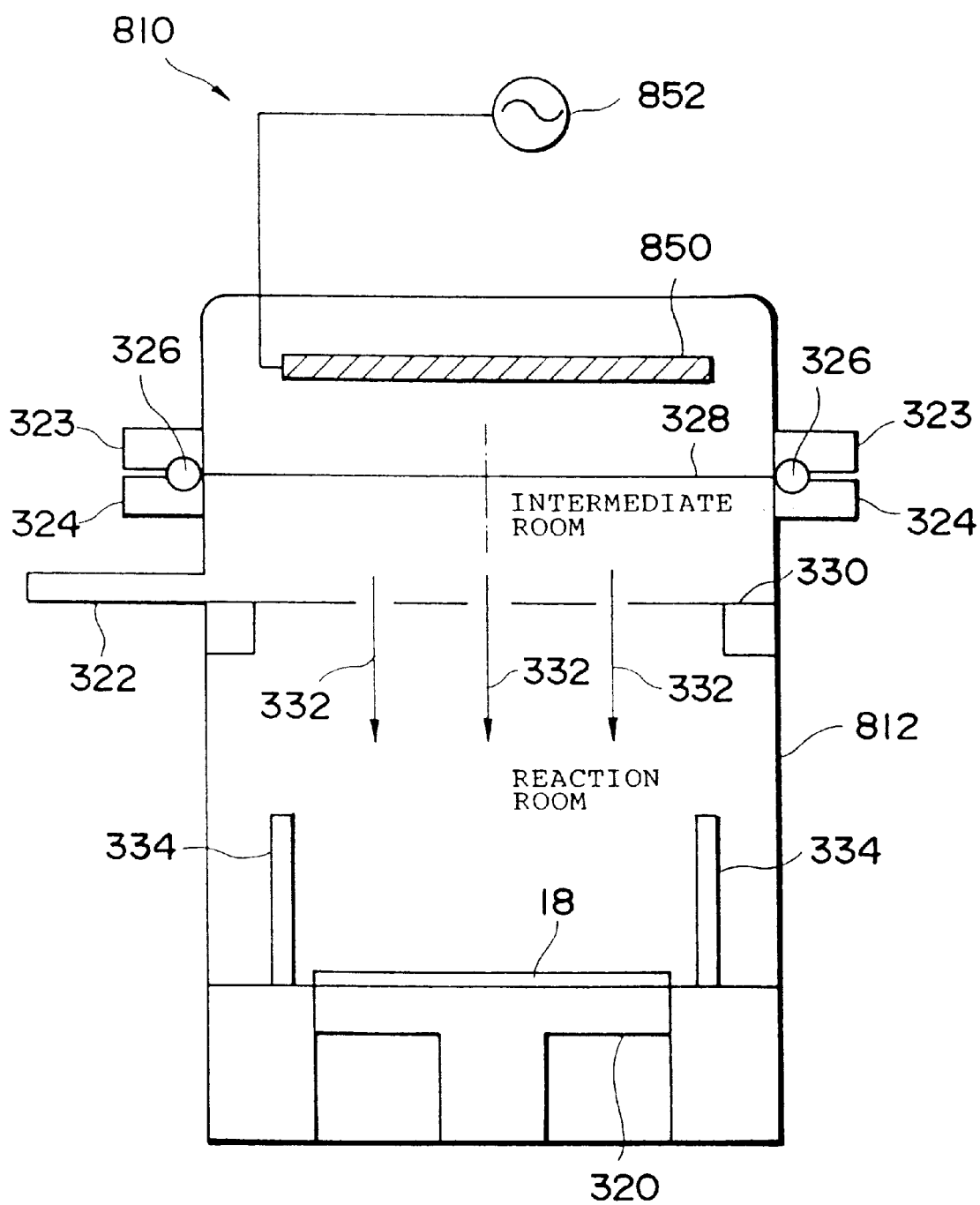
FIG. 8 is a sectional view of a differential pressure RF inductive coupling microwave plasma jet apparatus used in Example 7.
Figure 9:
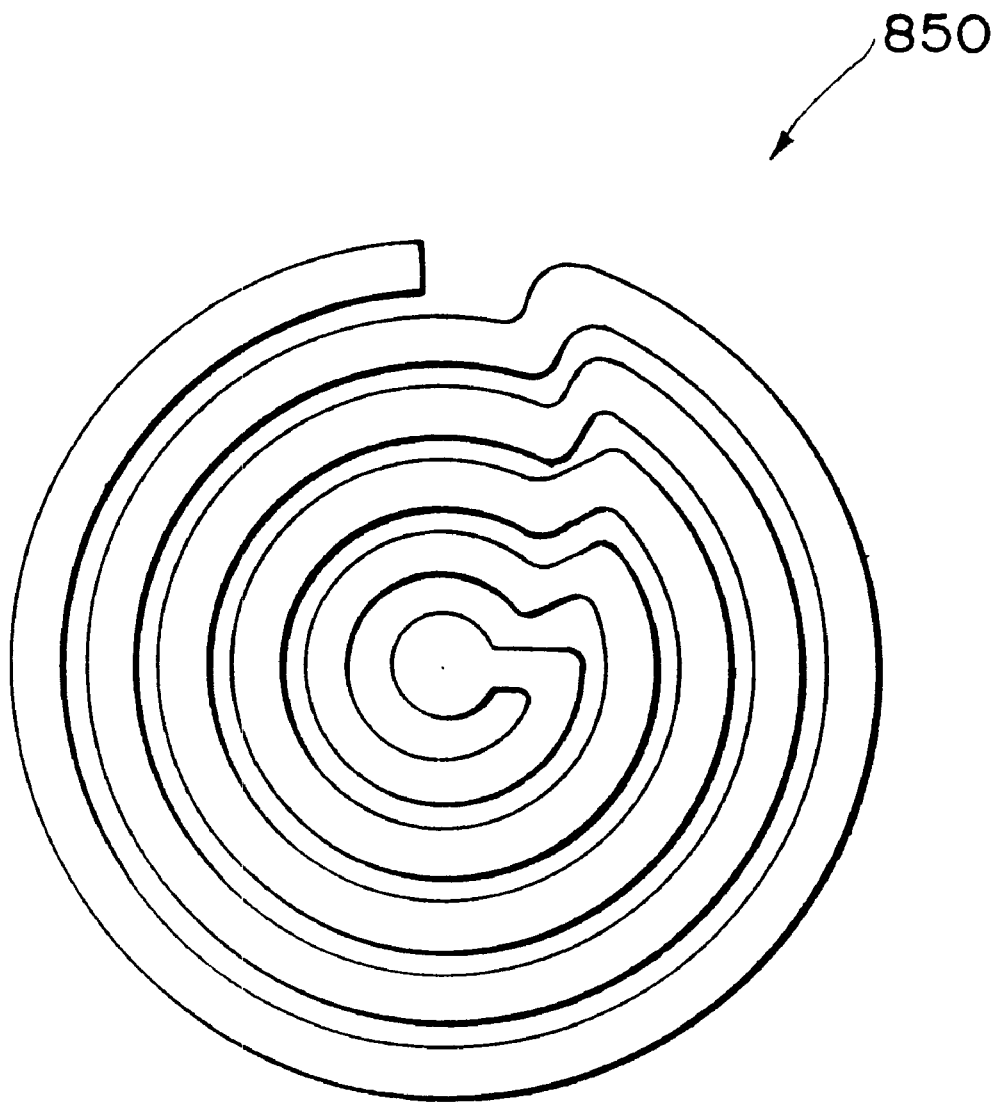
FIG. 9 is a plan view of a coil for guiding RF in Example 7.

FIG. 8 is a sectional view of a differential pressure RF inductive coupling plasma jet apparatus 810 used in Example 7. As shown in FIG. 8, the RF inductive coupling plasma jet apparatus (RFIC plasma jet apparatus) 810 has, at the upper portion of a reaction chamber 812, a coil 850 for applying an RF from an RF source. The coil 850 has a shape as shown in the plan view of FIG. 9.

The materials and arrangements of a vacuum window 328 and a conductance regulating window 330 of the RFIC plasma jet apparatus 810 are the same as those of the vacuum window 328 and the conductance regulating window 330 of the microwave plasma jet apparatus as shown in, e.g., FIG. 3.

The gas flow rates and pressure were the same as those in Example 1. An RF of 13.6 MHz and 5 kW was applied from the RF source to the coil 850, and diamond was formed on a substrate 18, as in Example 1. More specifically, even using an RF, diamond could be grown, as in Example 1. In addition, as in Example 1, no damage to the vacuum window and the conductance regulating window was observed.

When diamond was etched using this RFIC plasma jet apparatus 810, as in Example 5, an etch rate similar to that in Example 5 was achieved.

When c-BN was synthesized using this RFIC plasma jet apparatus 810, as in Example 6, it was confirmed that c-BN was synthesized, as in Example 6.

Example 7 can be variously changed and modified. For example, instead of the inductive coupling plasma jet apparatus using a coil to apply RF power, a capacitive coupling plasma jet apparatus which applies RF power by using parallel plates arranged in the reaction chamber may be used for deposition of diamond materials.

EXAMPLE 8

In eighth example, synthesis of the hard material by using a quartz bell jar as a reaction chamber, is illustrated. A horn-shaped microwave applicator is circumferentially placed over the bell jar reaction chamber to cover the bell jar, so that the bell jar wall of the present example is also capable of functioning a microwave entrance window. This constitution has an advantage in which the entire apparatus can be simplified. A quartz cylinder is disposed around a substrate holder within the bell jar, as the apparatus of Example 1, and a quartz conductance regulating window is mounted onto the quartz cylinder. Further, additional exhaust port of reaction gas is disposed in the vicinity of a region in which a plasma is created, so that doping to the hard material can be accomplished.

The substrate holder is connected to a driving unit, so that the substrate holder is capable of rotating. Gas boundary layer can be thinner by rotating substrate on the substrate holder at higher rotating speed, resulting the deposition onto the substrate at increased deposition rate.

Figure 12:
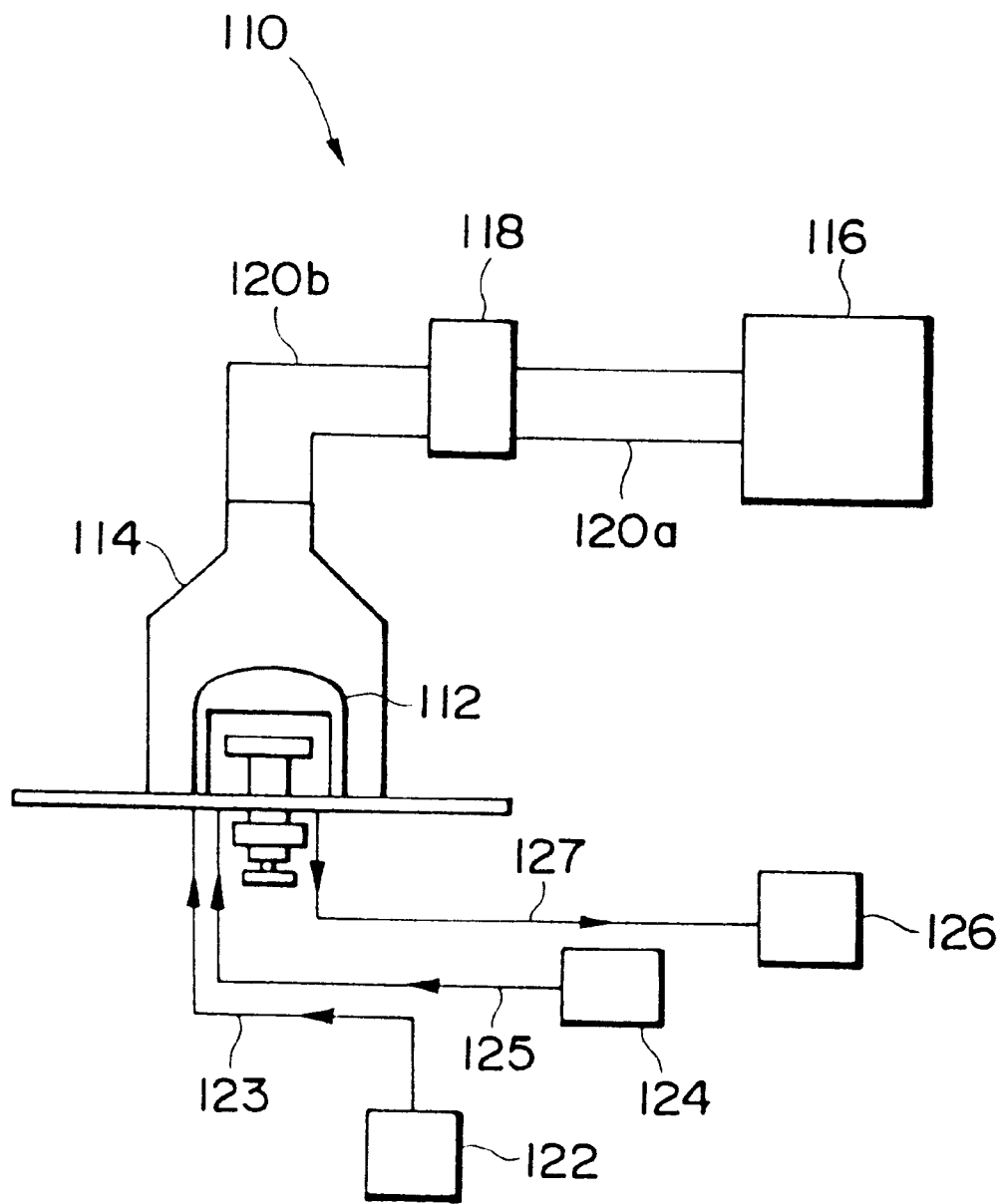
FIG. 12 schematically illustrates a processing apparatus for the eighth example, comprising a bell jar reaction chamber and a horn shaped microwave applicator.

FIG. 12 schematically illustrate a processing apparatus for the eighth example. As shown in FIG. 12, a processing apparatus 110 comprises a quartz bell jar 112 having a function as a reaction chamber. A horn-shaped microwave applicator 114 for applying microwave to bell jar 112 is disposed over bell jar 112 to cover and include entire bell jar. Microwave applicator 114 is connected with a microwave source 116 through waveguides 120a and 120b. A microwave tuner 118 is interposed between microwave source 116 and applicator 114.

As shown in FIG. 12, a first reaction gas source 122 is connected to bell jar 112 through a gas conduit 123. In addition, a second reaction gas source 124 is connected to bell jar 112 through another gas conduit 125. A vacuum pump is 126 is connected to bell jar 112 through yet another gas conduit 127, for evacuating bell jar. The precise control of flow rate of a gas flow 139 through a conductance regulating window 134 and flow rate of reaction gases required for the deposition can be accomplished for desired chamber pressure, by providing two gas conduits 123 and 125. In this example, first and second gas sources supply same mixture of reaction gases having same composition.

Figure 13:
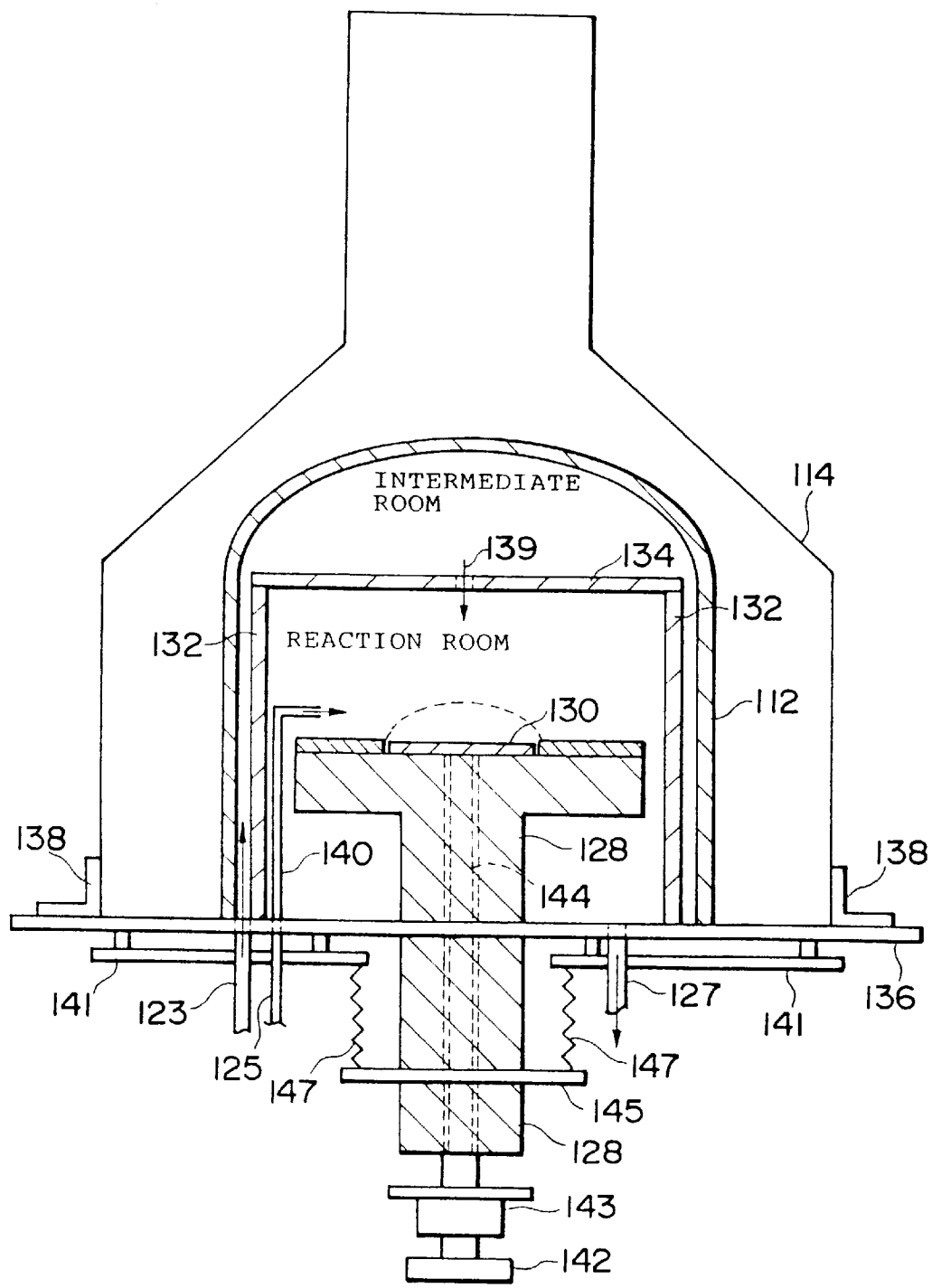
FIG. 13 is a cross sectional view of the bell jar reaction chamber shown in FIG. 12.

FIG. 13 illustrates the details of bell jar 112 and microwave applicator 114. As shown in FIG. 13, a substrate holder 128 for holding a substrate 130 is located at a center of the interior of quartz bell jar. In FIG. 13, the situation of substrate 130 of being held onto the holder is exaggerated, and the details of substrate holder 128 will be fully described later.

As shown in FIG. 13, a quartz cylinder 132 is disposed within bell jar 112 to surround substrate holder 128. A conductance regulating window 134 is mounted on the upper end of quartz cylinder 132, so that the interior of bell jar 112 is partitioned by conductance regulating window 134 into a intermediate or interposed room outside the window and a reaction room inside the window. Bell jar 112 is affixed onto a flat bottom plate 136. A horn-shaped microwave applicator 114 is put on bottom plate. Applicator 114 and bottom plate 136 is electromagnetically sealed by an annular sealing ring 138 to avoid any microwave leakage. Side wall of microwave applicator 114 is formed of plural openings having diameter of 10 mm or less for the observations and measurements of plasma, at a interval of at least 3 mm, preferably of 5 to 10 mm.

As shown in FIGS. 12 and 13, gas conduit 123 from first gas source 122 communicates with the intermediate room, which is located within bell jar 112 and outside quartz cylinder 132 and conductance regulating window 134. On the other hand, gas conduit 125 from second gas source 124 communicates with a tube 140, the end of which is located in the reaction room, which is inside quartz cylinder 132 and conductance regulating window 134. Therefore, two reaction gas flows are provided within bell jar 112. Gas from first reaction gas source 122 is supplied into the intermediate room, and flows into the reaction room through conductance regulating window 134 as shown by an arrow 139. Gas from second gas source is directly supplied into the reaction room. Bottom plate 136 is additionally connected with a gas conduit 127 which is connected to a vacuum pump 126.

This gas inlet/exhaust arrangement can provide advantages: quartz cylinder 132 and conductance regulation window 134, which are directly heated by plasma, and bell jar, which is heated by radiation from heated cylinder 132 and window 134, are cooled by creating reaction gas flow between quartz bell jar 112 and quartz cylinder 132 to avoid overheating of the apparatus. Simultaneously, reaction gas is heated. Thus, heated gas can be supplied into the reaction region, so that deposition rate increases.

As shown in FIG. 13, an annular flange 141 for being attached with a bellows 147 is affixed to bottom plate 136. An annular bellows affixing plate 145 is attached to the lower part of a substrate holder 128, circumscribing the cylindrical surface of the lower part of substrate holder 128. Bellows 127 is disposed between flange 141 and bellows affixing plate 145, surrounding substrate holder 128. Bellows 147 has functions to adjust the height and horizontal position of substrate holder 128.

Figure 14:
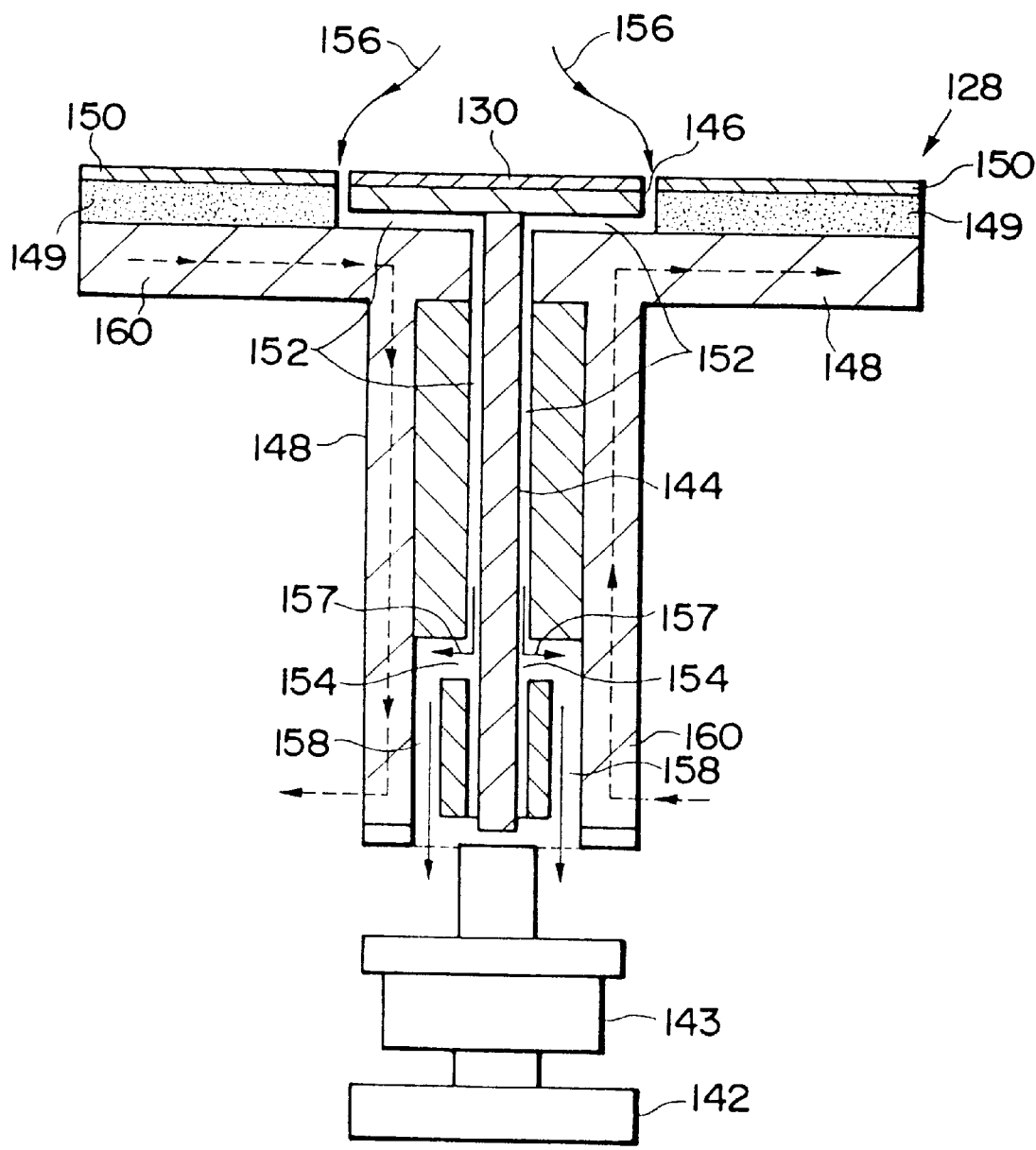
FIG. 14 is a detailed cross sectional view of the substrate holder already shown in FIGS. 12 and 13.

A shaft passing through the center of substrate holder 128 is connected to a driving means, which comprises a motor 142 for rotating at higher speed and a magnetic fluid bearing 143. Uniform deposition onto the substrate can be achieved by rotating substrate at higher rotating speed. However, in processing apparatus 110 of this example, plasma tends to converge in the vicinity of the substrate, by the gas flow 139 through conductance regulating window 134 into the reaction room. Consequently, the temperature of substrate 130 will considerably increase. Since shaft 144 connected to the substrate receiving portion is made of "SUS 310S" stainless steel, which has poor thermal conductivity, heat given to substrate 130 from the plasma can not effectively be transferred to the outside, thereby the temperature of the entire shaft 144 becomes very much higher. It is necessary to effectively transfer heat from shaft 144 to avoid damaging magnetic fluid bearing 143 which is connected to the lower end of shaft 144. In this apparatus, substrate holder 128 has a constitution, which is shown in FIG. 14. The substrate holder also has a function to effectively transfer heat from the substrate.

FIG. 14 schematically illustrate a cross section of substrate holder 128 used in this example. Referring to FIG. 14, substrate holder 128 comprises: a disk-shaped substrate receiver 146 made of molybdenum, for receiving a disk shaped substrate 130; a shaft 144 made of "SUS 310S" stainless steel connected to substrate receiver 146; a substrate holder body 148 circumferentially surrounding substrate receiver 146; an annular copper ring 149 disposed on substrate holder body 148; and an annular quartz ring 150 disposed on copper ring 149. A clearance 152 having width of 0.1 to 10 mm is defined by substrate receiver 149, substrate holder body 148, copper ring 149 and quartz ring 150, to form gas passage at the side of and under substrate receiver 146. Clearance 152 having similar width further extends through the side of shaft 144. An exhaust piping 158 is formed at the outside of clearance 152. Clearance 152 has openings 154 opened to exhaust piping 158 near the lower part of shaft 144. Thus, clearance 152 functions as a gas passage, through which gas passes through clearance 152, and flows toward exhaust piping 158 via openings 154, as shown by an arrows 157. Shaft 144 is connected to a driving means, which comprises a motor 142 for rotating at higher speed and a magnetic fluid bearing 143. A conventional jacket constitution for flowing cooling medium as shown by arrows 160 is included within substrate holder body 148, the details of which is not described here.

In substrate holder 128 shown in FIG. 14, a reaction gas mixture comprising larger part of "highly thermal conductive" hydrogen gas flows within clearance 152, which is defined by substrate receiver 146 and shaft 144, in order to compensate poor heat transfer due to poor thermal conductivity of SUS 310S shaft 144. In this constitution, substantial amount of heat in shaft 144 can be transferred outside, via gas flow created within clearance 152. That is, the high speed substrate rotation also achieves effective gas diffusion into clearance 152, as well as uniform deposition .In this example, substrate 130 rotates at about 1,000 r.p.m. The rotation speed may be preferably at a speed ranging from about 300 r.p.m. to about 3,000 r.p.m.

Another advantage of the high speed substrate rotation is that plasma can be moved away from the conductance entrance window toward the vicinity of substrate 130, by forming gas flow (shown by arrow 156 in FIG. 14) toward the vicinity of substrate 130. In addition, the high speed rotation of the substrate can cause an "exhaust effect" to effectively create a pressure difference between upper side and lower side of the substrate receiver. Such effect of the high speed substrate rotation is generally described in, for example, R. Pollard and J. Newman, "Silicon deposition on a rotating disk", J. Electrochem. Soc., Vol. 127, pp. 744 (1980).

In this example, shaft 144 has a diameter of 10 mm, and a length of about 60–70 mm. Thermal conductivity (k) of shaft 144 is 20 (W/mK). Heat transfer from shaft 144 to gas within clearance 152 was found to be performed substantially by thermal conduction, and it was also found that efficient heat transfer was achieved. In the processing condition shown later, substrate temperature will be higher than 1,000° C., if such heat transfer are not performed. In the apparatus according to the present invention, as shown in FIG. 14, deposition was carried out, with maintaining the temperature of the lower end of shaft 144 to be about 100° C. and without seriously damaging magnetic fluid bearing 134 by heat from substrate.

Next, two exemplary embodiments of diamond deposition using the apparatus shown in FIGS. 12 to 14 will be described. First, a deposition of a born doped diamond will be described, and then a deposition of an undoped diamond will be shown.

Boron doped diamond was deposited onto a 4 inch disk (diameter:about 102 mm) silicon substrate via microwave plasma CVD, by employing the processing apparatus shown in FIGS. 12 to 14, under the following process conditions:

Hydrogen ($H_2$) volumetric flow rate: 1 (SLM);
Methane ($CH_4$) volumetric flow rate: 0.03 (SLM);
Carbon dioxide ($CO_2$) volumetric flow rate: 0.01 (SLM);
Diborane ($B_2H_6$) volumetric flow rate: 0.1 (SLM) (diborane was diluted with $H_2$ to 1,000 ppm);
Chamber pressure: 100 (Torr);
Microwave frequency: 2.45 (GHz);
Microwave power: 12 (kW);
Substrate temperature: 1,000 (° C.); and
Substrate rotation speed: 1,000 (rpm), ("SLM": Standard Liter per Minute).

The pressure within the intermediate room was 300 Torr. Each of the gas volumetric flow rates represents the sum of gases flowing in conduits 123 and 125.

Boron doped diamond was deposited on the 4 inch Si substrate under the above processing conditions at a deposition rate of 4.1 ($\mu$m/hr). Further, variation of thickness of the deposited diamond could be limited within 3% from the desired thickness, by optimizing the flow rate through the conductance regulating window and the flow rates through conduits. After deposition, Si substrate was completely dissolved with fluoric and nitric acids to form self-standing boron doped diamond. The resistivity of the obtained doped diamond was measured, and the result was 0.02 ($\Omega$cm).

Next, undoped diamond was deposited under the same processing condition for boron doped diamond shown above, except that diborane gas was not supplied. Before commencing the deposition of undoped diamond, quartz bell jar 112, quartz cylinder 132, conductance regulating window 134 and substrate receiver 146, all of which had been used for the deposition of boron doped diamond, were replaced to new ones, to avoid contamination.

Undoped diamond was deposited on the 4 inch Si substrate at a deposition rate of 5 ($\mu$m/hr). After deposition, Si substrate was completely dissolved with fluoric and nitric acids to form self-standing undoped diamond. The transparency of the obtained undoped diamond was evaluated, and the obtained transmittance of the undoped diamond was 71%, which is almost the same value as a theoretical ideal transmittance of undoped diamond. Thus, the obtained undoped diamond is found to have excellent properties for window materials. The resistivity of the obtained undoped diamond was measured and the result was higher than $10^{10}$ ($\Omega$cm). Therefore, there was no unintentional doping due to the previous doping processes, in the obtained undoped diamond.

According to the present invention, different processing apparatus is not required for deposition of different materials. That is, one apparatus is applicable to deposition processes of various materials having variety of compositions, because the elements of the processing apparatus exposed to the processing conditions, such as quartz bell jar 112, quartz cylinder 132, conductance regulating window 134, substrate receiver 146 and quartz ring 150, can be readily replaced with new elements for the use in different material processing. In addition, reproducibility of doping concentration can be enhanced, by using different elements exposed to processing condition for the deposition of material having different doping concentration.

Comparative examination was carried out, for the purpose of demonstrating the effect of the high speed substrate rotation, in which boron doped diamond was deposited on 4 inch Si substrate under the same processing condition shown above except that substrate receiver did not rotate. The deposition rate under the condition in which substrate did not rotate was 3.5 ($\mu$m/hr), and thickness distribution was 5 (%). Further, the temperature of the lower end of the substrate holder shaft significantly increased. Therefore, it was demonstrated that the rotating of the substrate is advantageous in improving uniformity of the deposited film, and in eliminating the overheating of the shaft.

Figure 15:
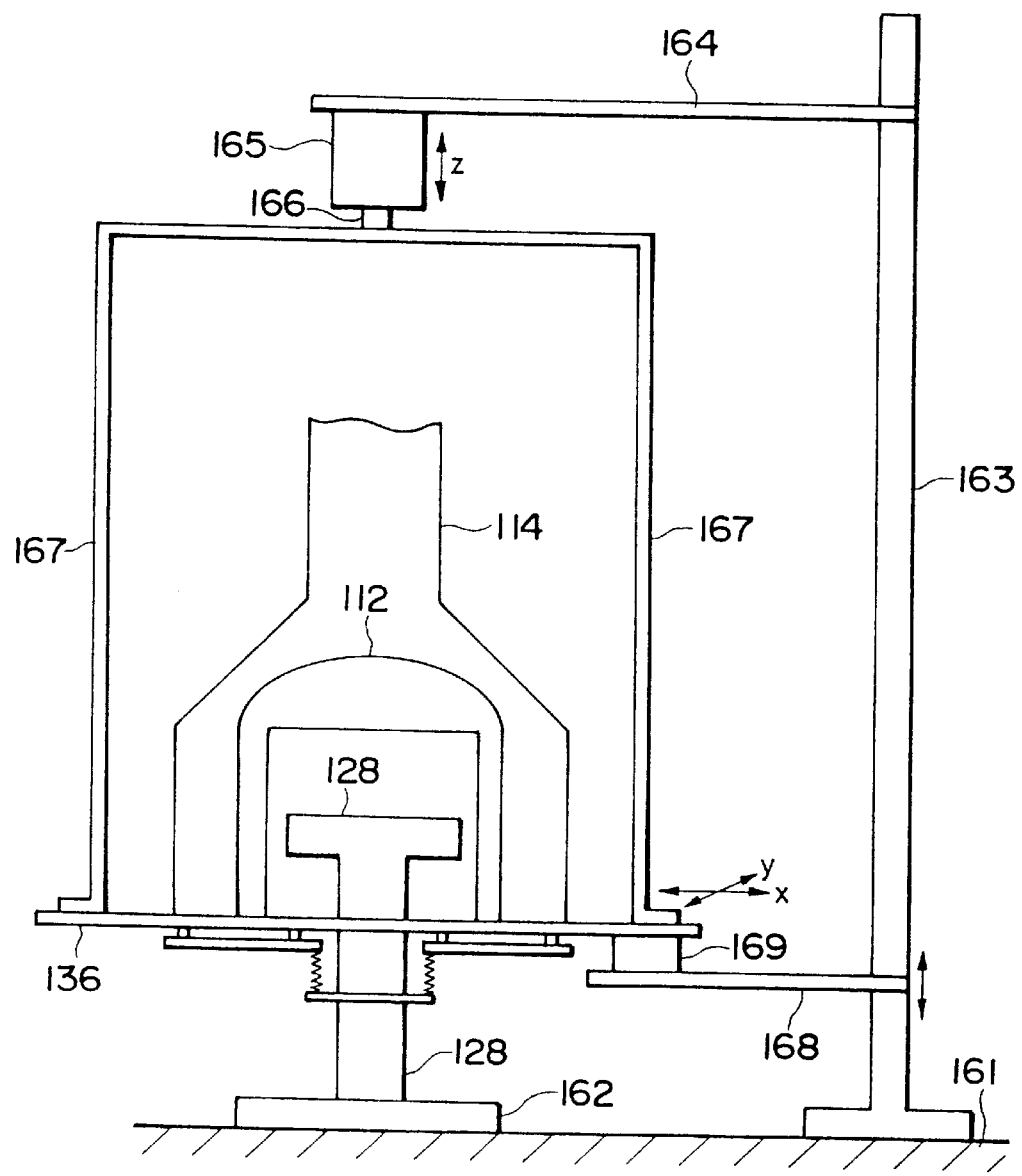
FIG. 15 schematically illustrates an apparatus which is capable of three-dimensinally moving the microwave applicator against the substrate holder.

An modification of this example will be described below. The processing apparatus can further be equipped with a means for spaciously moving the bell jar and the microwave applicator relative to the substrate holder, for the purpose of depositing materials over the entire surface of larger sized substrate than 4 inch disk. In FIG. 15, a processing apparatus is illustrated, which is capable of horizontally and vertically moving bell jar 112 and microwave applicator 114, while substrate holder 128 is fixed and not movable.

Referring to FIG. 15, substrate holder 128 is directly fixed to a fixing base 162 which is fixed to a floor 161. This apparatus does not have means for rotating substrate such as motor or magnetic fluid. A post 163 is also fixed to floor 161. A horizontal pole 164 is connected to post 163 at the upper part of post 163. A step motor 169 for vertically or normally moving (in z-direction) is fixed to opposite end of pole 164. A supporting frame 167, which is fixed to bottom plate 136 having bell jar 112 and microwave applicator 114 thereon, is connected to a motor shaft 166, which drives normal moving created by normal step motor 169. A second pole 168 is also connected to lower part of post 163. Second pole 168 is capable of vertically moving along post 163, with maintaining the connection with post 163. An x-y stage 169 having two step motors, one of which is for longitudinal movement and another is for transverse movement, is fixed to opposite end of second pole 168. In FIG. 15, only one x-y stage appears, however, plurality of x-y stage are circumferentially disposed and connected to bottom plate 136, having equal spacing between x-y stages. The plurality of x-y stages support bottom plate 136 via ball bearings (not shown).

As described above, the processing apparatus shown above is capable of longitudinally, transversely and normally moving bell jar 112 and microwave applicator 114, while substrate holder 128 is fixed and not movable, so that plasma can uniformly contact over the entire are of larger substrate. In this case, substrate rotation is not necessary for single purpose of improvement of film uniformity. Nevertheless, film uniformity can be further improved by additionally rotating substrate.

Although this example have been described with referring to microwave plasma processing apparatus, this example can be applied to an RF inductively coupling processing apparatus, by replacing the horn-shaped microwave applicator to a coil for applying RF as shown in Example 7. In such modification, various advantage of the apparatus disclosed above can be provided.

EXAMPLE 9

In the ninth Example, a graphite conductance regulating window was used in the same processing apparatus 110 having bell jar reaction chamber 112. It was found that the graphite conductance regulating window can provide further converging of plasma between the graphite window and the substrate. In addition, the graphite conductance regulating window also functions as an additional carbon source, so that methane concentration in the reaction gas mixture can be reduced. Further, the graphite conductance regulating window also has a function as a counter electrode, thereby enhancing the density of plasma formed above the substrate.

Figure 16:
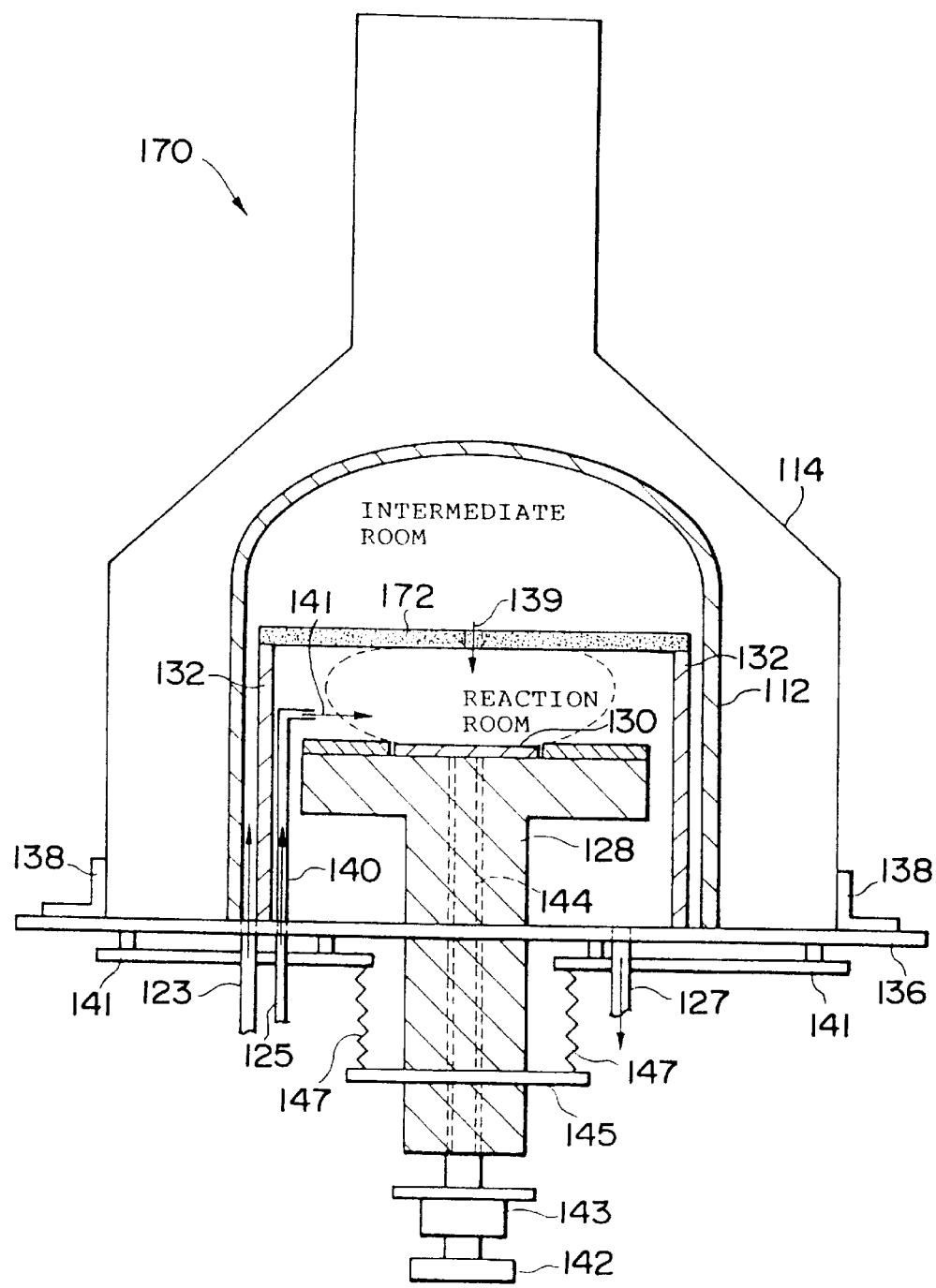
FIG. 16 is a cross sectional view of the microwave applicator and the bell jar used in Example 9.

FIG. 16 schematically illustrates a cross section of the bell jar of a processing apparatus 170 which was used in this example. As can be seen in FIG. 16, processing apparatus 170 has the same constitution as the processing apparatus shown in FIGS. 12, 13 and 14, except that a graphite conductance regulating window 172 is disposed on quartz cylinder 132 within the bell jar. Undoped diamond was deposited by using the apparatus 170, under the following processing conditions:

Hydrogen ($H_2$) volumetric flow rate: 1 (SLM);

Methane ($CH_4$) volumetric flow rate: 0.01 (SLM);

Carbon dioxide ($CO_2$) volumetric flow rate: 0.01 (SLM);

Chamber pressure: 100 (Torr);

Microwave frequency: 2.45 (GHz);

Microwave power: 12 (kW);

Substrate temperature: 1,000 (° C.); and

Substrate rotation speed: 1,000 (rpm), ("SLM": Standard Liter per Minute).

Undoped diamond was deposited on the 4 inch Si substrate at a deposition rate of 10 ($\mu$m/hr). It was also found by observing plasma through the opening in the side wall of the microwave applicator that plasma effectively converged between the graphite conductance regulating window and the substrate. Further, in order to obtain such a high growth rate as 10 ($\mu$m/hr) without using graphite window, variation of thickness of the deposited diamond could be limited within 5% from the desired thickness, by optimizing the flow rate through the conductance regulating window and the flow rates through conduits. However, in this example, 5% variation could be readily obtained without precise regulation of the gas flow rates through the window and conduit 140, because the graphite window can provide the effective converging of the plasma.

Next, Si substrate was completely dissolved with fluoric and nitric acids to form self-standing undoped diamond. The transparency of the obtained undoped diamond was evaluated, and the obtained transmittance of the undoped diamond was 69% from the infrared range to the ultraviolet range, which is close to the theoretical ideal transmittance of undoped diamond. Thus, the obtained undoped diamond is found to have excellent properties for window materials.

Some modifications can be made, by focusing the graphite window's function as additional carbon source, in which the conductance regulating window is made of quartz, and an additional graphite counter electrode is disposed within the reaction room.

EXAMPLE 10

In the tenth example, undoped diamond was deposited on a substrate in the same manner as in Example 8, except that the processing apparatus is provided with a means for biasing the substrate.

Figure 17:
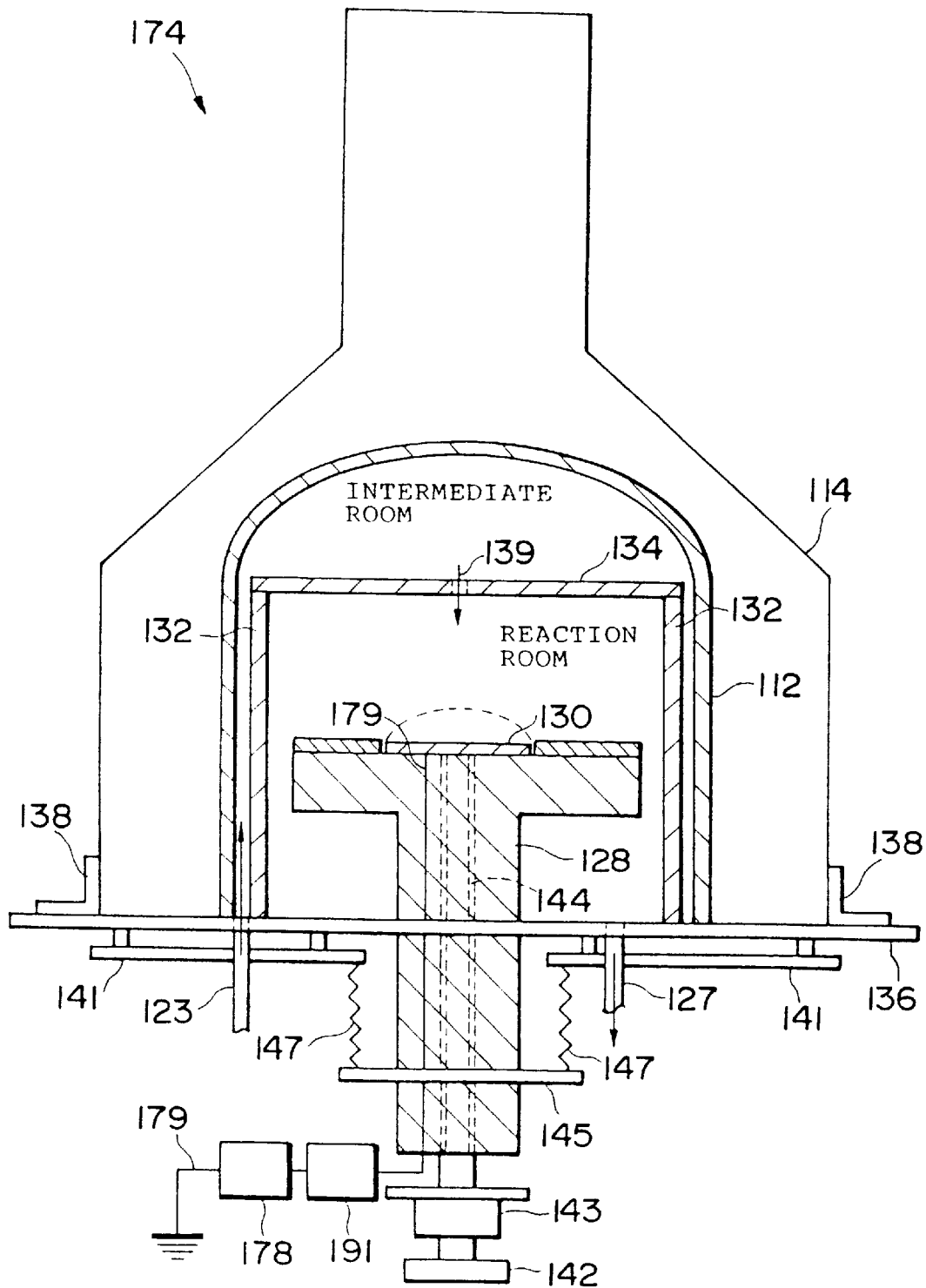
FIG. 17 is a cross sectional view of the microwave applicator and the bell jar used in Example 10.

FIG. 17 schematically illustrates a cross section of a bell jar 174 used in this example. As shown in FIG. 17, in the substrate holder of apparatus 174, the substrate receiver contacting substrate 130 is electrically connected to an RF power source 178 through an RF matching device 191 via a conductive wire 179.

In this example, two step-biasing was employed in the process of depositing epitaxial undoped diamond having (100) orientation onto 3 inch Si substrate of (100) orientation, under the following two step-process conditions:

(the first step)

Hydrogen ($H_2$) volumetric flow rate: 1 (SLM);

Methane ($CH_4$) volumetric flow rate: 0.06 (SLM);

Carbon dioxide ($CO_2$) volumetric flow rate: 0;
Chamber pressure: 100 (Torr);
Microwave frequency: 2.45 (GHz);
Microwave power: 5 (kW);
Substrate temperature: 1,000 (° C.);
RF power (13.56 Hz): 500 (W);
Substrate self bias: −210 (V); and
Duration: 10 (min.),
(the second step)
Hydrogen ($H_2$) volumetric flow rate: 1 (SLM);
Methane ($CH_4$) volumetric flow rate: 0.05 (SLM);
Carbon dioxide ($CO_2$) volumetric flow rate: 0.01 (SLM);
Chamber pressure: 100 (Torr);
Microwave frequency: 2.45 (GHz);
Microwave power: 12 (kW);
Substrate temperature: 1,000 (° C.);
RF power (13.56 Hz): 1 (kW);
Substrate self bias: −250 (V); and
Duration: 100 (hr).

Deposition of undoped diamond onto the 3 inch Si (100) substrate was performed at a deposition rate of 6 ($\mu$m/hr). It was also found that variation of thickness of the deposited diamond was limited within 2% from the desired thickness.

In employing the constitution of this apparatus, RF also contribute to plasma enhancing, so that higher deposition rate than in processing without substrate biasing can be achieved.

Figure 18:
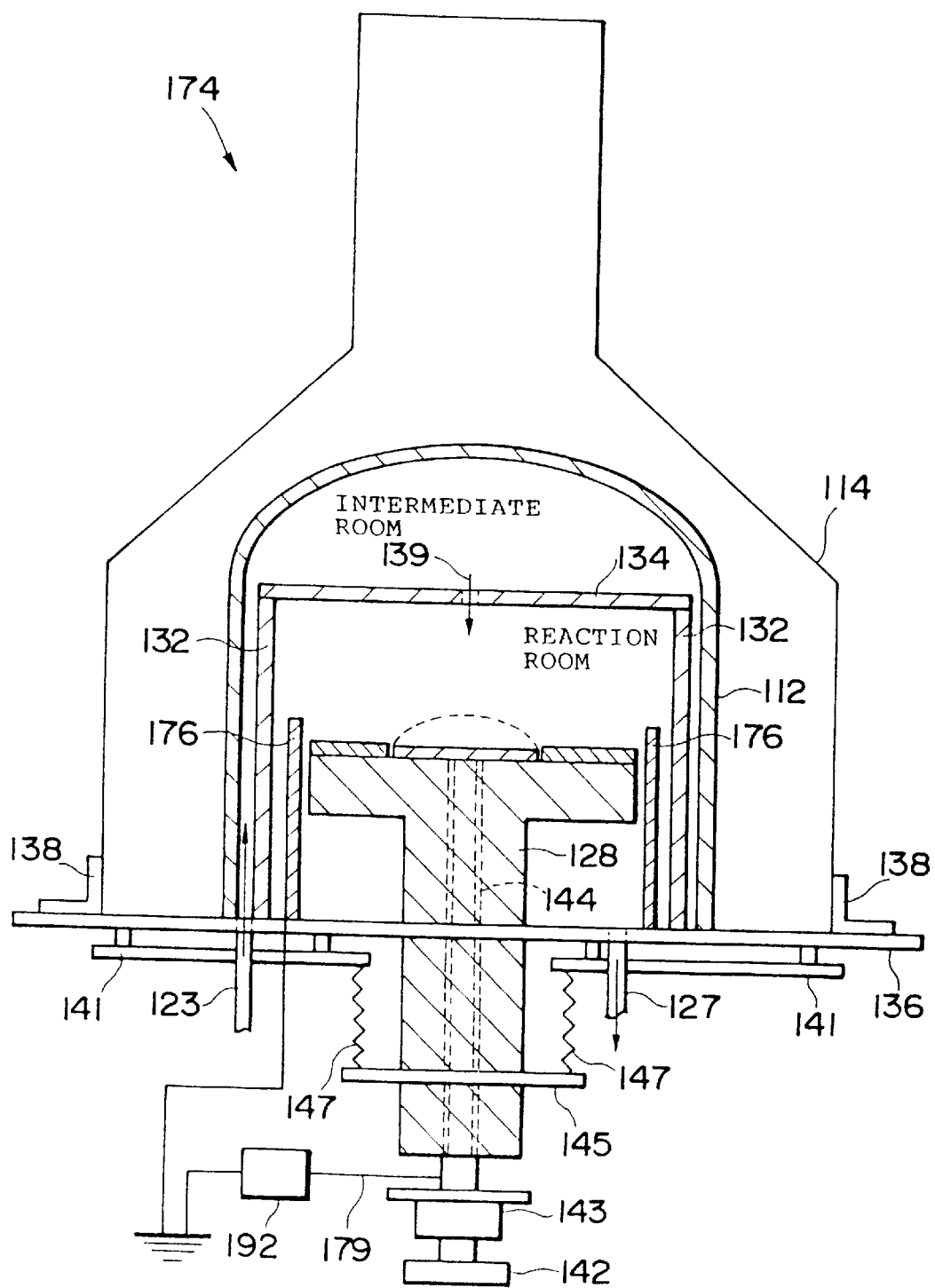
FIGS. 18 and 19 are the cross sectional views of the microwave applicator and the bell jar used in Example 11.

A variation of this example was also carried out, in which only a DC bias was applied by a DC power source 192 shown in FIG. 18 at the initial deposition stage through a cylindrical ground electrode 176 shown in FIG. 18, which is further disposed around substrate holder within quartz cylinder 132.

Diamond (100) was epitaxially deposited on Si (100) substrate by the DC biasing method described here. The DC biasing method has an advantage in simplifying the processing apparatus, in which the apparatus does not require the RF power supply or RF matching device, but just require simple DC power supply. Nevertheless, the uniformity of the deposited diamond film is slightly reduced as compared from the films deposited by RF biasing method, to a variation of the thickness of 4%.

EXAMPLE 11

In the eleventh example, the apparatus was provided with a substrate-substrate facing constitution, in which an additional substrate holder, instead of the previously mounted conductance regulating window, is disposed on the quartz cylinder. Sidewall of the quartz cylinder is provided with a through hole for introducing gas into the reaction room. That is, the side wall of the quartz cylinder also functions as a conductance regulating window. Such constitution of the apparatus allows to create plasma between the two substrates, and to deposit on a surface of each substrate at the same time. In addition, the substrate also functions as a counter electrode, so that the plasma density can be further enhanced.

Figure 19:
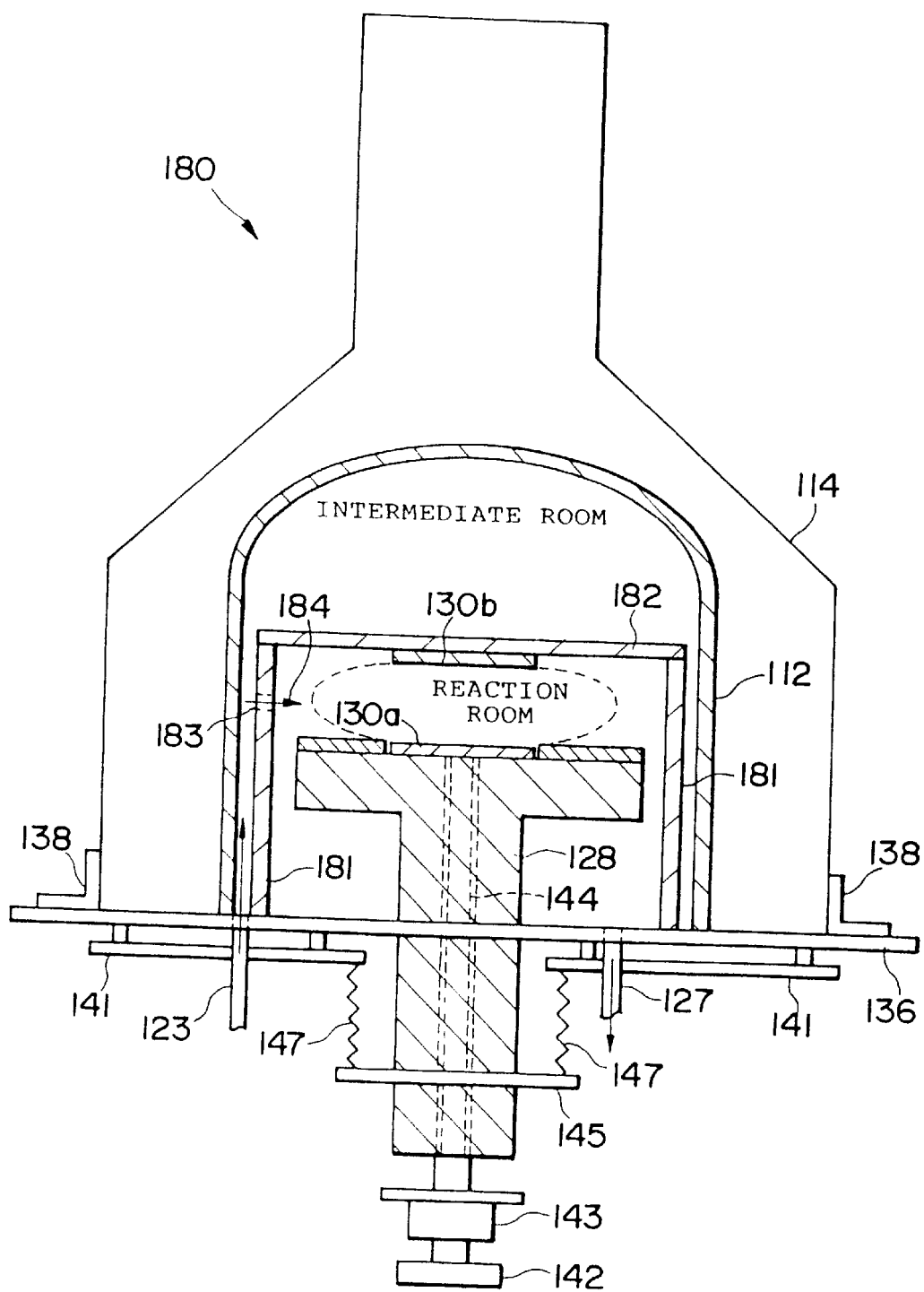

FIG. 19 schematically illustrates a cross section of a bell jar 180 used in this example. As shown in FIG. 19, a substrate holder 182 holding a substrate 130b is mounted on a quartz cylinder 181 within the bell jar of the apparatus 180 so that substrate 130b faces another substrate 130a mounted on substrate holder 128. A through hole 183 for introducing gas into the reaction room is formed on the side wall of quartz cylinder 181. The quartz cylinder wall having such through hole 183 also functions as a conductance regulating window, through which a gas flow toward the reaction room is created as shown by an arrow 184.

Undoped diamond layers were deposited onto a surface of each 4 inch substrate 130a and 130b under the same processing conditions as used in Example 8, at deposition rates of 4.5 ($\mu$m/hr) for substrate 130a and 2.5 ($\mu$m/hr) for substrate 130b.

EXAMPLE 12

In the twelfth example of the present invention, silicon carbide (SiC) was deposited by using the processing apparatus shown in FIGS. 12 to 14.

In this example, different gases were introduced via gas conduits 123 and 125, respectively. First gas source 122 is capable of supplying hydrogen ($H_2$) gas, and second gas source 124 is capable of supplying a mixture of monosilane gas ($SiH_4$) and propane gas ($C_3H_8$. Hydrogen gas is introduced from first gas source 122 through gas conduit 123 into a region within bell jar 112 and outside quartz cylinder 132 (i.e., into the reaction room). Therefore, gas flowing through conductance regulating window (side wall of quartz cylinder) along arrow 139 into the reaction room is hydrogen gas. Mixture of $SiH_4$ and $C_3H_8$ is supplied from second gas source through conduit 124, and directly introduced into the reaction room via a conduit 140. In this example, the high speed rotation of the substrate was also performed.

SiC was deposited on 4 inch Si substrate under the following condition:

Hydrogen ($H_2$) volumetric flow rate: 5 (SLM);
Monosilane ($SiH_4$) volumetric flow rate: 0.5 (SLM);
Propane ($C_3H_8$) volumetric flow rate: 1 (SLM);
Chamber pressure: 100 (Torr);
Microwave frequency: 2.45 (GHz);
Microwave power: 16 (kW);
Substrate temperature: 1,500 (° C.); and
Substrate rotation speed: 1,000 (rpm).

Deposition of SiC onto the 4 inch Si substrate was performed at a deposition rate of 50 ($\mu$m/hr). It was also found that variation of thickness of the deposited SiC was limited within 5% from the desired thickness after 100 hr deposition run, by optimizing the flow rate through the conductance regulating window and the flow rates through conduits.

EXAMPLE 13

Figure 20:
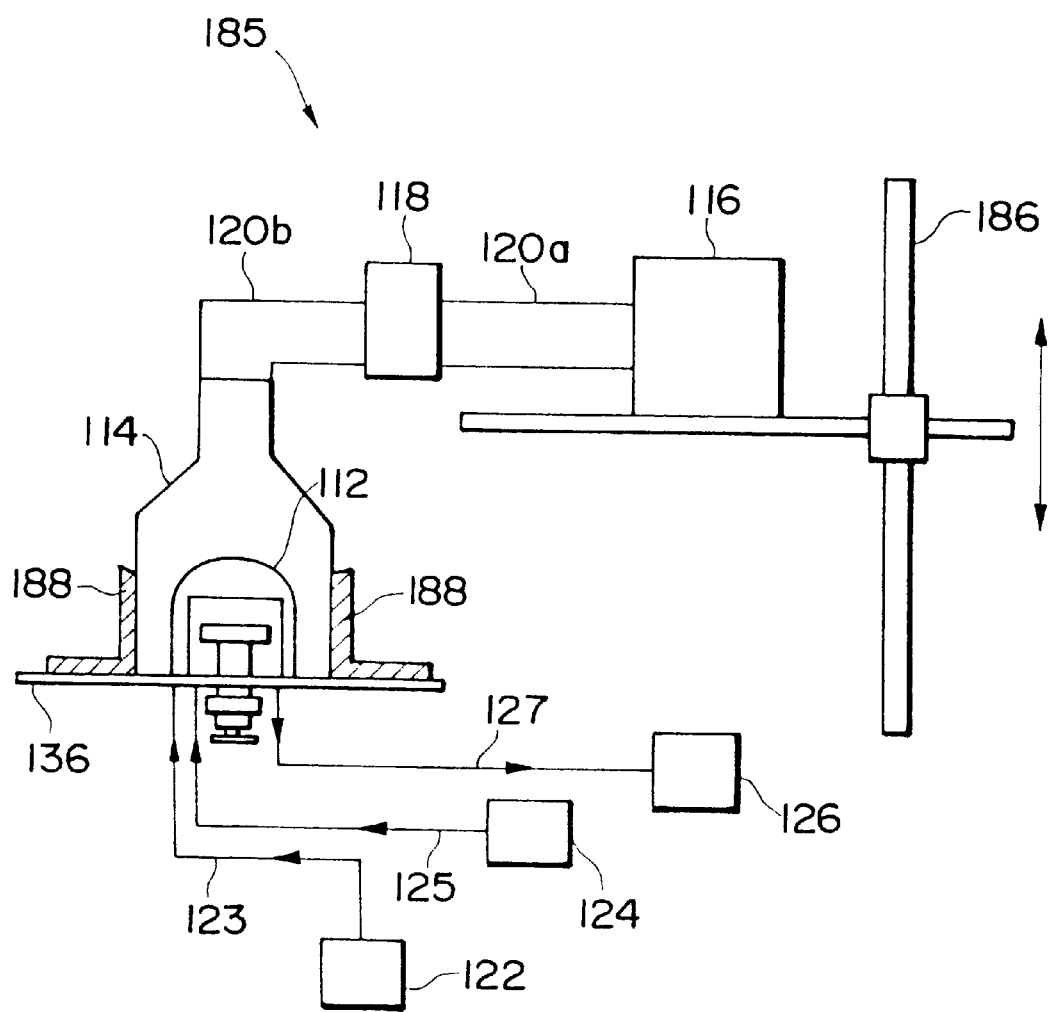
FIG. 20 schematically illustrates an apparatus used in Example 13.

In the thirteenth example of the present invention, the apparatus is provided with a means for normally moving the microwave applicator to extend and contract the wave guiding length, in order to optimizing the matching and mode adjusting of microwave. FIG. 20 schematically illustrates a processing apparatus used in this example.

Referring to FIG. 20, a processing apparatus 185 is additionally equipped with a post 186 having lifting means for normally or vertically moving the microwave equipments, to the processing apparatus used in Example 8 shown in FIG. 12. Post 186 supports a microwave source 116. Bell jar 112 and bottom plate 136 are fixed to an appropriate floor, although microwave applicator 114 is not fixed to bottom plate 136 (this is not shown in FIG. 20). Thus, microwave applicator 114 is capable of moving upward from and downward to bottom plate 136. This allows to vary the cavity height of the applicator to optimize the matching of microwave and to adjust the mode of microwave.

Figure 21:
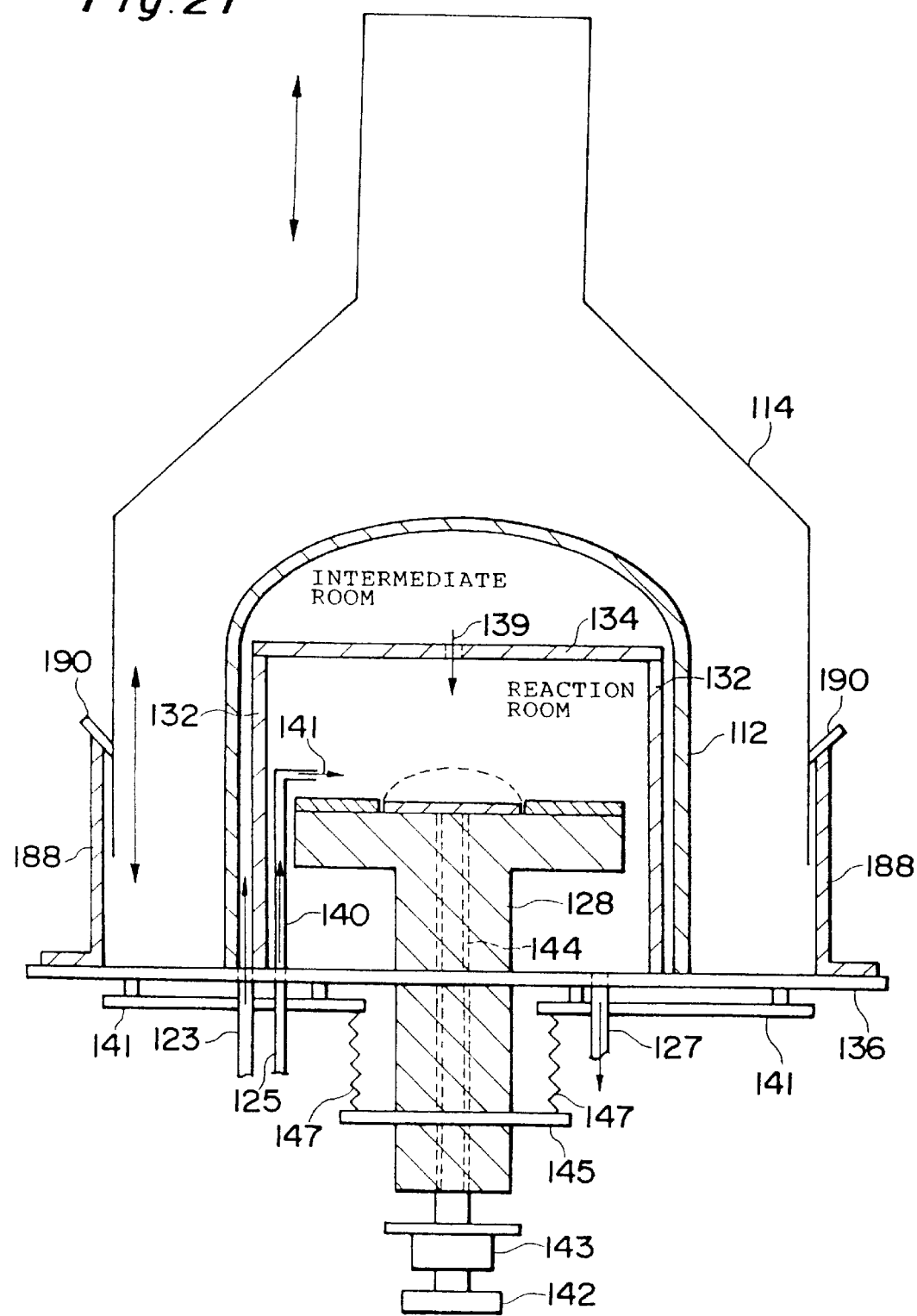
FIG. 21 is a cross sectional view of the microwave applicator and the bell jar used in Example 13.

FIG. 21 schematically illustrates a cross section of a microwave applicator and a bell jar of a processing apparatus 185 used in this example. AS shown in this figure, a cylindrical sealer 188 is placed on bottom plate 136 to enclose microwave applicator 114, in order to electromagnetically sealing applicator 114 and bottom plate 136 to avoid any microwave leakage. The bottom flange of sealer 188 make a closed contact with bottom plate 136. Since sealer 188 mere makes contact with and is not fixed to bottom plate 136, the apparatus can be equipped with x-y stage as shown in FIG. 15, in order to move bottom plate 136 and substrate holder in relation to microwave applicator. This allows to deposit uniform layer across the surface of the substrate. The inside diameter of sealer 188 is set to be slightly larger than the outside diameter of applicator 114, so that a clearance of 0.1 to several mm width is formed between microwave applicator 114 and sealer 188, for facilitating smooth vertical moving of applicator 114. FIG. 21 illustrates applicator 114 being in the position in which applicator 114 is lifted away from bottom plate 136. As can be seen in FIG. 21, interior of applicator 114 communicates to the clearance between applicator 114 and sealer 188, when applicator is in such position. In order to eliminate any leakage through the clearance, a shield finger 190 made of beryllium copper is disposed at the upper end of sealer 188 so that shield finger 190 closely cover and seal both sealer 188 and applicator 114. Shield finger 188 circumferentially surrounds entire applicator 114.

Figure 22A:
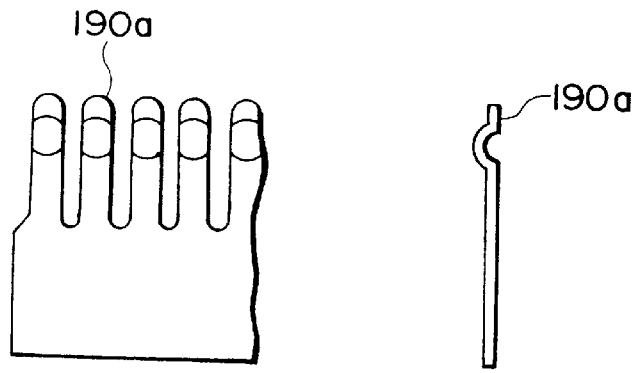
FIGS. 22A to 22C are the front views and the side views of the preferable shield finger for the use in the present invention.
Figure 22B:
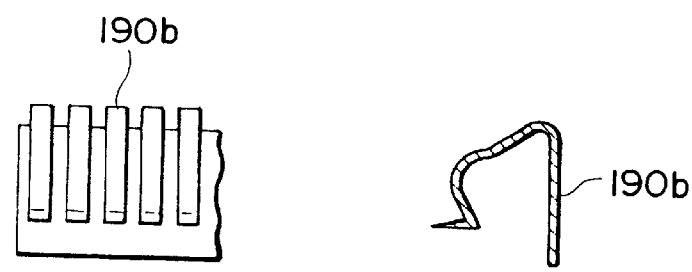
Figure 22C:
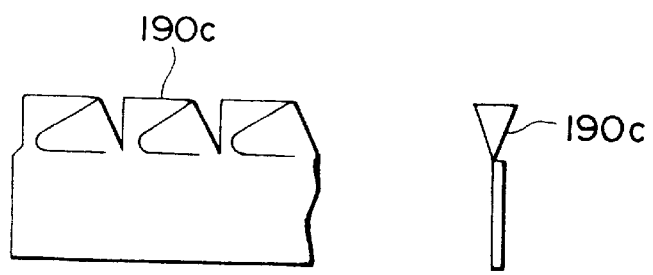

Preferable geometries of shield finger for the present invention may be, for example, a shield fingers 190a, 190b and 190c, which are shown in FIGS. 22A, 22B and 22C, respectively. In this example, a shield finger commercially available from TECHETCH was used to allow vertical movement of applicator 114 while eliminating leakage of microwave.

Next, the matching of microwave will be described as follows. Referring now to FIGS. 21 or 12, the preferable processing apparatus according to the present invention is provided with a tuner 118 between a microwave source 116 and applicator 114. In such constitution where the matching is accomplished by only tuner 118 itself, there may be a problem of creating unwanted standing wave within a waveguide 120b between tuner 118 and applicator 114. Such standing wave may apply an overwhelming load to tuner 118, and tuner 118 will be seriously damaged by the overwhelming load.

The processing apparatus of this example can overcome such problem. The cavity height of microwave applicator 114 can be varied by vertically moving applicator 114 to match microwave through waveguide, thereby eliminating the forming of standing wave. Further, mode of microwave can be adjusted to a desired mode by the vertical movement of applicator 114.

In optimizing the matching of microwave and adjusting the mode of microwave, a numerical simulation on the basis of an assumption in which microwave applicator can be regarded as a cylindrical cavity resonator, is conducted to determine desired dimension of the resonator (i.e., microwave applicator) for efficiently guiding microwave toward the substrate. Details of the simulation will be described below.

A series of calculation of electric field in TM mode (transverse magnetic mode) created by an ordinary coaxial antenna were carried out for a cylindrical cavity having radius "a" and length "l". In the expression in the cylindrical coordinate (r, z, $\phi$), following equations can be obtained in each direction of the cylindrical coordinate to express electric field within the cylindrical cavity resonator for $TM_{mnp}$ mode:

$$E_Z = E_{mnp} - J_m(k_c r) - \cos m\phi - \cos k_z Z$$

$$E_r = \left(\frac{p\pi}{k_{cl}}\right) E_{mnp} - J'_m(k_c r) - \cos m\phi - \sin k_z Z$$

$$E\phi = \left(\frac{mp\pi}{k_c^2 rl}\right) E_{mnp} - J_m(k_c r) - \sin m\phi - \sin k_z Z$$

where,
each of m, n, p: an integer;
$J_m(K_c r)$: a Bessel function of first class in "m"th $$k_c = \frac{\rho_{mn}}{a} \quad k_z = \frac{p\pi}{l}$$

order;
$J'_m(K_c r)$: a derivative of $J_m(K_c r)$;
$\rho_{mn}$: "n"th solution of $J_m(\rho)$ This numerical calculation was carried out by using Bessel function of "m"th order and its derivative, and by using "n"th solution of the "m"th order Bessel function $\rho_{mn}$ as a constant. Here, the physical concepts of the integers m, n and p are as follows: integer m gives an order of Bessel function which determines electric field strength in r-direction, and also gives orders of trigonometric functions which determines the strength of electric filed in $\phi$-direction. That is, integer m involves the determination of numbers of nodes and anitinodes of the electric field strength in redirection, as well as distributions of the electric filed strength in r-direction and in $\phi$-direction. Integer n involves the determination of numbers of nodes and anitinodes of the electric field strength in redirection. Integer p involves the determination of numbers of nodes and anitinodes of the electric field strength in z-direction.

Next, it is much desirable for the cylindrical cavity resonator to have a specified dimension and geometry to have a resonance frequency which is identical to the frequency $\Delta_0$ of given microwave, for the purpose of efficiently guiding microwave. When this criterion is satisfied, following relationship is established:

$$\lambda_0 = \frac{1}{\sqrt{(k_c/2\pi)^2 + (p/2l)^2}}$$

Figure 23:
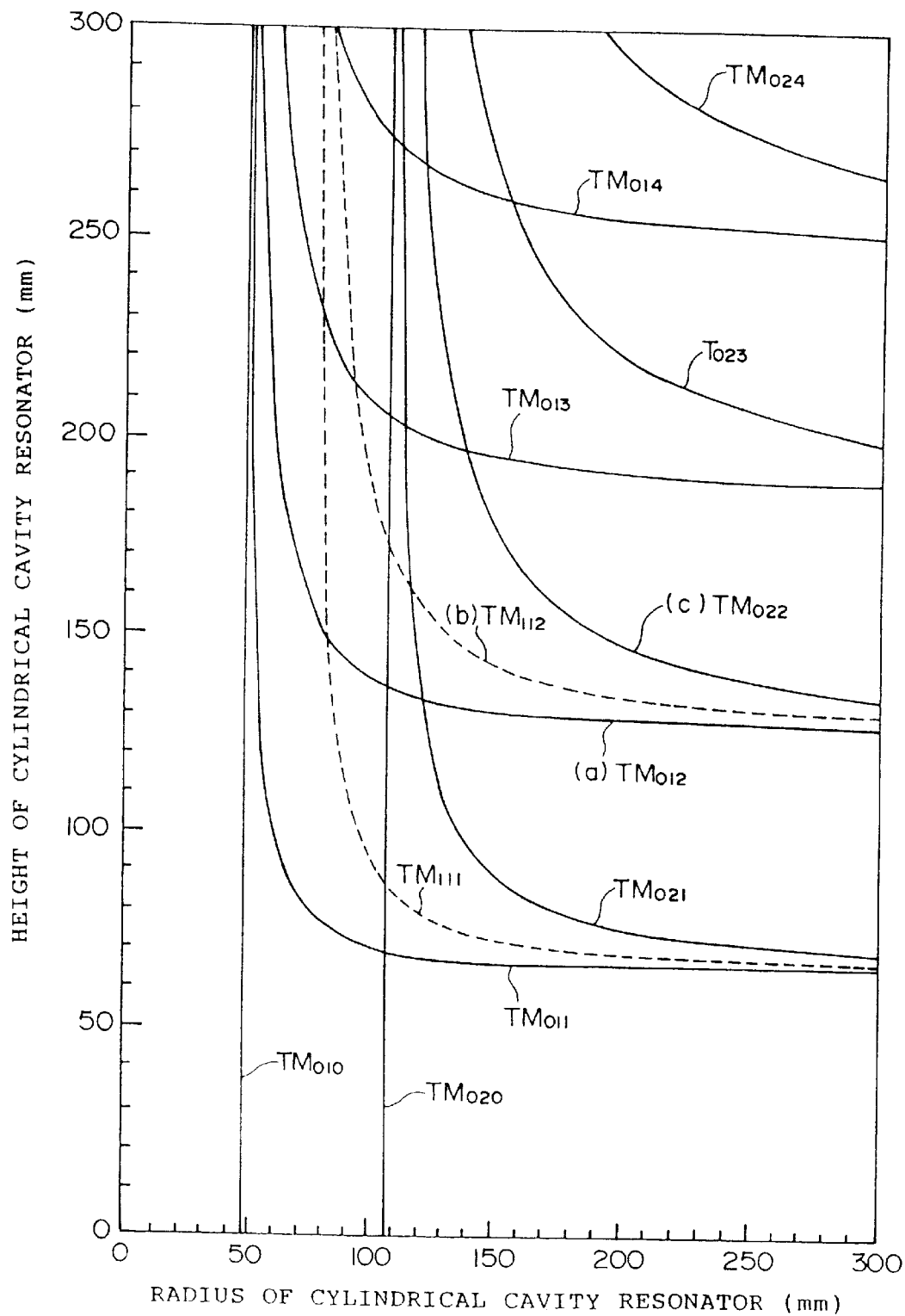
FIG. 23 is a graph showing the relationship of the height and the radius of the cylindrical cavity resonator for the desired resonance condition at Δ=2.45 GHz.

FIG. 23 shows desired relationships of the heights and radii of cylindrical cavity resonator, which satisfy the above equation at $\Delta_0$=2.45 GHz to give the condition for resonance. In FIG. 23, for example, the condition for resonance of $TM_{012}$ mode can be found with a solid line (a). In such case, the height for resonance at 2.45 GHz should be 126 mm, when the radius of the resonator is 190 mm.

For example, when p equals 2, the desirable relationships of the height and the radius of the cylindrical cavity resonator are given by lines (a), (b), and (c) in FIG. 23. FIGS. 24A, 24B and 24C illustrate the distributions of the electric field strength within the cylindrical cavity resonator having radius of 190 mm, which are obtained by numerical calculations according to the above equation.

Figure 25:
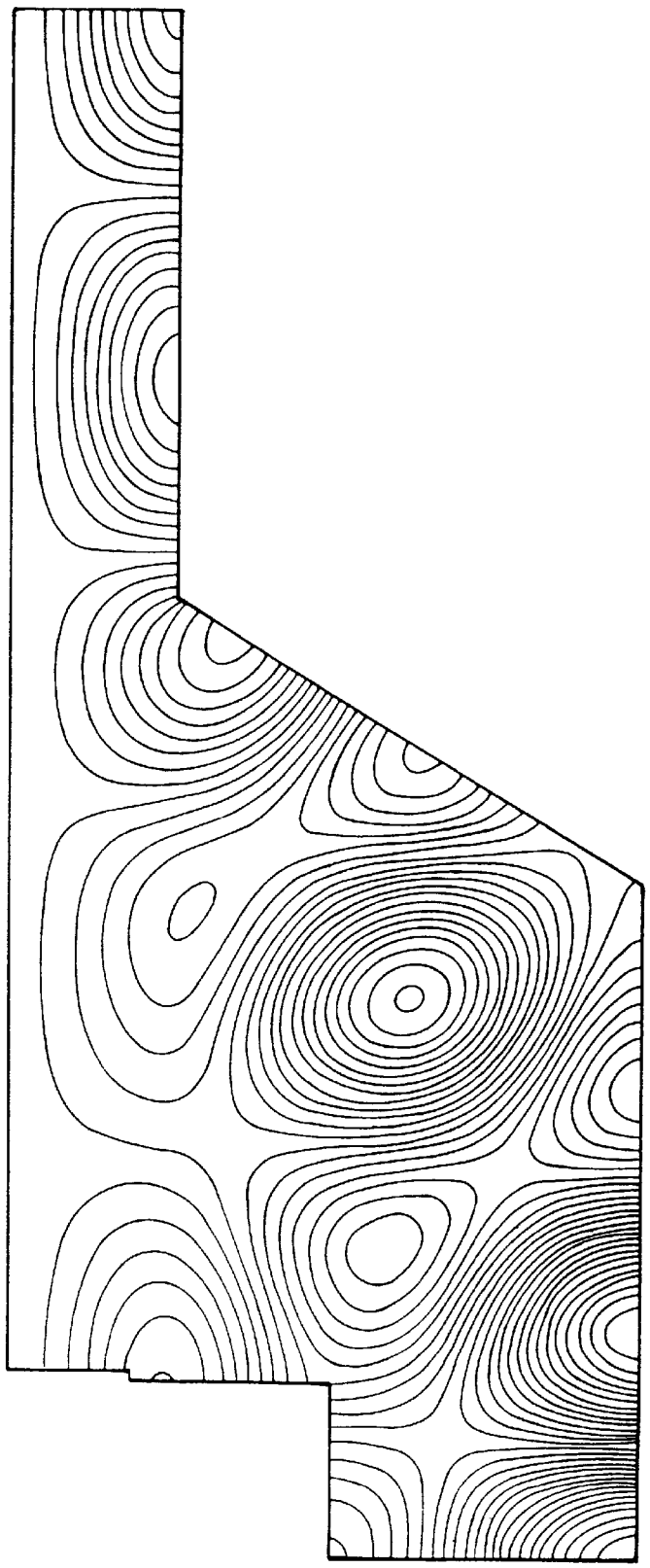
FIG. 25 is a graph showing the electric field distribution within the microwave applicator obtained in Example 13.
Figure 26:
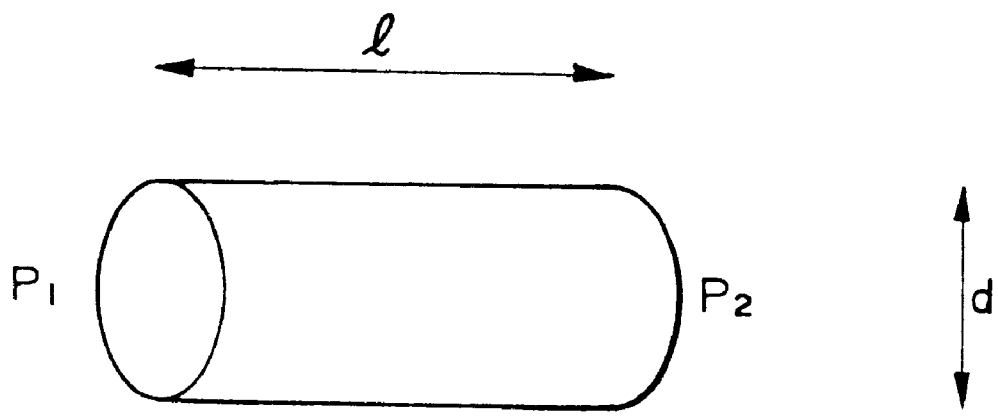
FIG. 26 schematically illustrates a cylinder model for obtaining the relationship of a conductance and a flow rate.

Further numerical simulation was carried out in order to obtain the distribution of the electric field strength within the microwave applicator, which was used in the examples of the present invention, by using similar simulation method as used in the simulation for the cylindrical cavity resonator. The obtained distribution is shown in FIG. 25. Therefore, it was demonstrated that the height of the microwave applicator can be optimized to give desired microwave mode and desired resonance condition.

As has been described above in detail, when the film formation or etching apparatus of the present invention is used, the window can be prevented from being heated or sputtered by the plasma, and the plasma can be stably maintained even at a relatively high pressure.

Therefore, even a substance such as diamond which requires a high processing pressure can be stably formed or etched for a long time.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.7-206211/1995 filed on Aug. 11, 1995 is hereby incorporated by reference.

What is claimed is:

1. A processing apparatus in which an electromagnetic wave is guided into a reaction chamber through an entrance window to create a plasma from a gas in said reaction chamber for deposition or etching, said apparatus comprising:

a vacuum reaction chamber;

a means for introducing gases into said reaction chamber;

a means for evacuating gases from said reaction chamber;

a means for guiding the electromagnetic wave into said reaction chamber; and a conductance regulating element disposed within said reaction chamber and partitioning said reaction chamber into two regions, said two regions including a reaction region in which a substrate is placed on a substrate holding means, and an intermediate region between said reaction region and said entrance window, wherein said means for introducing gases is connected to said intermediate region, and said means for evacuating gases is connected into said reaction region, said conductance regulating element regulating gas flow from said intermediate region to said reaction region such that gas pressure in said intermediate region is higher than in said reaction region and gases in said intermediate region are not excitable by the electromagnetic wave guided into said reaction chamber.

2. An apparatus according to claim 1, wherein the pressure in the intermediate region is set at a pressure at which breakdown does not occur according to the Paschen's law represented as follows:

$$Eb = \frac{C_1 P}{C_2 + \ln(Pd)} \tag{1}$$

where,

Eb: breakdown voltage

P: pressure d: inter-electrodes distance $C_1$, $C_2$: constant depending on a gas type, and when P is large, said Paschen's law can be expressed by:

$$Eb = \frac{C_1 P}{C_2 + \ln(Pd)} < \frac{C_1}{C_2} P \tag{2}$$

3. An apparatus according to claim 2, wherein the pressure in the intermediate region is a pressure higher than a pressure for maintaining microwave discharge with respect to a predetermined electromagnetic wave, and a pressure in the reaction region is a pressure lower than the pressure for maintaining microwave discharge.

4. An apparatus according to claim 3, wherein said conductance regulating means has at least one through-hole, so that a gas flows from the intermediate region toward the reaction region through said through-hole of said conductance regulating means.

5. An apparatus according to claim 2, wherein the intermediate region has a pressure ranging from 100 Torr to 1,520 Torr (2 atom).

6. An apparatus according to claim 1, wherein said conductance regulating means has a shape conforming to a shape of the substrate or a shape of a three dimensionally-shaped base on which deposition or etching is performed.

7. An apparatus according to claim 1, further comprising a counter electrode which is arranged in one of the intermediate region and the reaction region, to face said substrate such that the electromagnetic wave guided into the reaction region creates a uniform electric field therewithin.

8. An apparatus according to claim 7, wherein said counter electrode is arranged in the intermediate region.

9. An apparatus according to claim 1, further comprising a conductive grid arranged between said conductance regulating means and said substrate arranged in the reaction region to shield said substrate from electromagnetic wave.

10. An apparatus according to claim 1, wherein said chamber is a bell jar, said bell jar itself functioning as said entrance window, and said apparatus further comprising a cylinder within said bell jar, said cylinder and said conductance regulation means partitioning the interior of said bell jar into said reaction region in which the substrate is placed and said intermediate region which is located outside said cylinder and inside said chamber.

11. An apparatus according to claim 1, further comprising a means for rotating said substrate at a high rotation speed higher than 100 r.p.m.

12. An apparatus according to claim 1, further comprising a means for applying an RF power to said substrate.

13. An apparatus according to claim 1, further comprising a counter electrode which is arranged in one of said intermediate region and said reaction region, to face said substrate such that the electromagnetic wave guided into said reaction region creates a uniform electric field therewithin, said counter electrode including a first material including an chemical species which is included in a second material, said second material being deposited on said substrate.

14. An apparatus according to claim 1, wherein said conductance regulating means includes a first material including an chemical species which is included in a second material, said second material being deposited on said substrate.

15. An apparatus according to claim 14, wherein said chemical species is a carbon atom, and said second material is a diamond.

16. An apparatus according to claim 1, further comprising within said chamber a second substrate holding means for holding a second substrate within said reaction region so that said second substrate faces said substrate, said second substrate functioning as a counter electrode.

17. An apparatus according to claim 1, further comprising a second gas introducing means, each of said means for introducing gas and said second gas introducing means having a respective flow rate adjusting means for separately adjusting gas flow rate.

18. An apparatus according to claim 10, wherein said means for guiding the electromagnetic wave is a microwave application means, said microwave application means having a microwave applicator and a waveguide, said microwave applicator being disposed to cover said bell jar.

19. An apparatus according to claim 18, further comprising a means for moving said microwave applicator relative to said substrate.

20. An apparatus according to claim 18, further comprising a means for varying a dimension of said microwave applicator to carry out optimizing the matching of the microwave and adjusting the mode of the microwave.

21. An apparatus according to claim 18, wherein said microwave applicator has a specified dimension and geometry being designed to create a desired electric filed in the vicinity of said substrate, said dimension and geometry being determined by a numerical simulation of the electromagnetic field within said microwave applicator.

22. An apparatus according to claim 10, wherein a gas passage of the gas introduced from said means for introducing gas is defined by said bell jar and said cylinder and communicates through said conductance regulating means, wherein the gas is heated when the gas passes through said passage, while said bell jar, said cylinder and said conductance regulating means are cooled with the gas.

* * * * *